(12) United States Patent
Narayan et al.

(10) Patent No.: US 10,747,640 B2
(45) Date of Patent: Aug. 18, 2020

(54) TECHNIQUES FOR MANAGING A DISTRIBUTED COMPUTING ENVIRONMENT USING EVENT DIGESTS

(71) Applicant: INTEL CORPORATION, Santa Clara, CA (US)

(72) Inventors: Ananth S. Narayan, Bangalore (IN); Lukasz Grzymkowski, Gdansk (PL); Mrittika Ganguli, Bangalore (IN); Mariusz Oriol, Gdynia (PL)

(73) Assignee: INTEL CORPORATION, Santa Clara, CA (US)

( * ) Notice: Subject to any disclaimer, the term of this patent is extended or adjusted under 35 U.S.C. 154(b) by 329 days.

(21) Appl. No.: 15/635,270

(22) Filed: Jun. 28, 2017

(65) Prior Publication Data
US 2018/0129503 A1   May 10, 2018

(30) Foreign Application Priority Data

Nov. 8, 2016  (IN) .............................. 201641038054
Dec. 17, 2016 (IN) .............................. 201641043106

(51) Int. Cl.
| | |
|---|---|
| G06F 11/34 | (2006.01) |
| G06F 9/38 | (2018.01) |
| H04Q 9/04 | (2006.01) |
| H03K 19/0175 | (2006.01) |
| G06F 9/50 | (2006.01) |
| H04Q 9/00 | (2006.01) |
| G06F 30/327 | (2020.01) |
| G06F 9/48 | (2006.01) |

(52) U.S. Cl.
CPC ........ *G06F 11/3476* (2013.01); *G06F 9/3844* (2013.01); *G06F 9/4881* (2013.01); *G06F 9/505* (2013.01); *G06F 30/327* (2020.01); *H03K 19/0175* (2013.01); *H04Q 9/00* (2013.01); *H04Q 9/04* (2013.01)

(58) Field of Classification Search
CPC ...... G06F 9/3844; G06F 9/505; G06F 17/505; G06F 9/327; G06F 9/4881; G06F 11/3486; H03K 19/0175; H04Q 9/00; H04Q 9/04
See application file for complete search history.

(56) References Cited

U.S. PATENT DOCUMENTS

| | | | |
|---|---|---|---|
| 9,349,010 B2 * | 5/2016 | Marr | G06F 21/572 |
| 2013/0191851 A1 * | 7/2013 | Archer | G06F 1/206 |
| | | | 719/313 |

(Continued)

*Primary Examiner* — Jacob D Dascomb

(57) ABSTRACT

Techniques and apparatus for managing a distributed computing environment using event digests are described. In one embodiment, for example, an apparatus may include at least one memory, and logic for a system manager, at least a portion of the logic comprised in hardware coupled to the at least one memory, the logic to determine a workload to schedule, access an event digest associated with a plurality of compute hosts, the event digest comprising event digest values determined using out-of-band information, determine metrics from the event digest, generate at least one host weight for at least a portion of the plurality of compute hosts based on the metrics, identify at least one candidate host from the portion of the plurality of compute hosts based on the at least one host weight, and schedule the workload on the at least one candidate host. Other embodiments are described and claimed.

25 Claims, 16 Drawing Sheets

(56) References Cited

U.S. PATENT DOCUMENTS

2014/0122834 A1\* 5/2014 Ganguli ............. G06F 11/3433
 712/30
2017/0031712 A1\* 2/2017 Dube .................... G06F 9/5011

\* cited by examiner

TECHNIQUES FOR MANAGING A DISTRIBUTED COMPUTING ENVIRONMENT USING EVENT DIGESTS

RELATED APPLICATION

This application claims priority to Indian Provisional Patent Application No. 201641038054, filed Nov. 8, 2016, and Indian Provisional Patent Application No. 2016641043106, filed on Dec. 17, 2016, the entireties of which are hereby incorporated by reference.

TECHNICAL FIELD

Embodiments described herein generally relate to information processing and, more specifically, but not exclusively, to techniques for generating and processing information for managing a distributed computing environment.

BACKGROUND

Hyperscale computing involves distributed computing environments (for example, a "cloud" computing environment) developed to scale exponentially, typically to hundreds or thousands of servers. Data centers employing hyperscale platforms require vast amounts of telemetry data and face substantive scalability issues. The telemetry processes in such environments require fast responsiveness and high polling rates. Accordingly, an increase in the number of monitored entities in a data center results in a proportional increase in, for example, the amount of data transferred to a corresponding controller, the processing cycles spent handling the data, or the amount of storage necessary to store the monitored data for post-processing and future analysis. With hyperscale data centers, such increases in resource and storage requirements may occur exponentially, resulting in scalability challenges.

DETAILED DESCRIPTION

Figure 1:
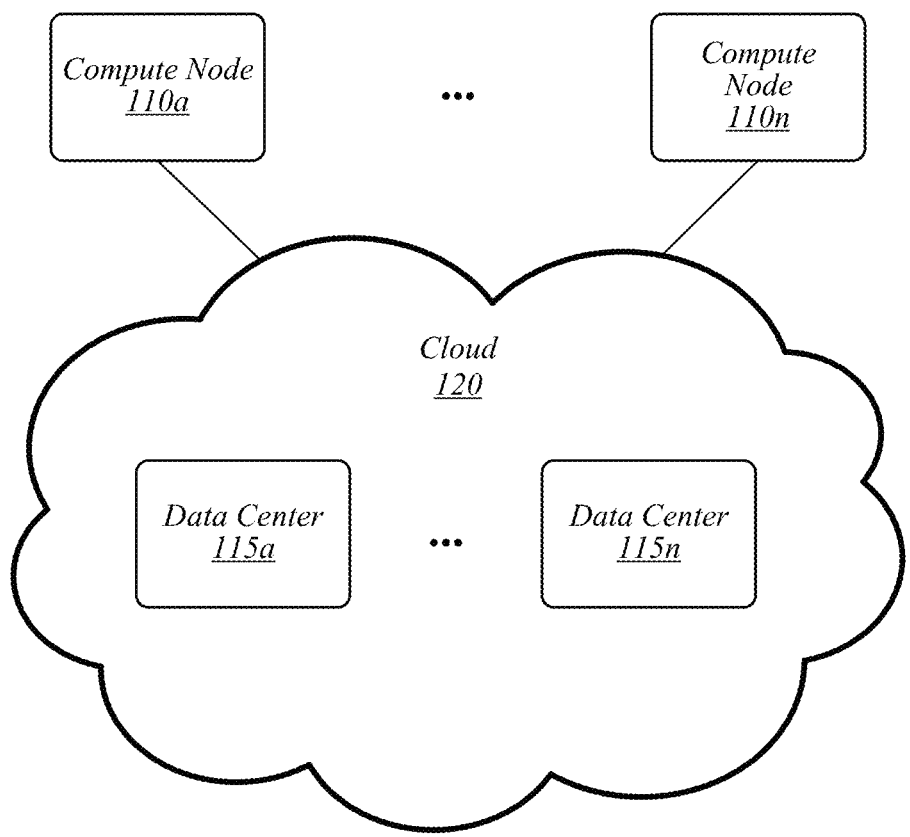
FIG. 1 illustrates an embodiment of a first operating environment.

Various embodiments may be generally directed to techniques for managing aspects of a distributed computing environment. Illustrative distributed computing environments may include a hyperscale computing environment, a cloud computing environment, data centers, and/or the like. In some embodiments, event digests may be used to monitor, perform scheduling, and support error handling in a distributed computing environment. In general, an event digest may include a representation of platform information, such as platform metrics. In some embodiments, the platform information may include out-of-band information. In some embodiments, an event digest may include a packet that provides information about which counters, metrics, or other information of a predetermined set of monitors incurred an event within a time interval under analysis. Illustrative and non-restrictive examples of an event may include an overflow event, an underflow event, or a threshold crossing event (for instance, when a given monitor has crossed a predetermined threshold). Embodiments are not limited in this context.

Hyperscale data centers require a vast amount of telemetry data and face material scalability issues. Non-limiting examples of telemetry usage within a hyperscale data center may include workload scheduling (for instance, by a cloud operating system (OS)), capacity planning and provisioning, load balancing, failure prediction and failover, workload fingerprinting, power management, thermal management, and/or the like. Some telemetry usages, such as fault detection and thermal management, require fast responsiveness and high polling rates. An increase in the number of monitored entities in a data center often results in a proportional increase in the amount of data transferred to a controller (for instance, a cloud controller or "system manager"), the processing cycles spent handling the data, and the amount of storage necessary to store the monitored data for post-processing and future analysis. With hyperscale data centers, such increases in resource and storage requirements may increase exponentially, resulting in scalability challenges. For example, challenges in hyperscale monitoring and usage may include size of monitoring data transferred, resource requirement at the compute host side to read and transfer the packet of metrics, resource requirements at the controller side to extract metrics, including the necessary metrics from the packet, and a growing number of telemetry sources on each platform (for instance, telemetry per-core, per-memory channel, per peripheral component interconnect express (PCIe) port, per virtual machine instance, and/or the like).

Accordingly, some embodiments may employ one or more event digest processes to address the challenges of hyperscale monitoring. An event digest may be aimed at addressing various problems that occur in monitoring, scheduling, and/or error handling within distributed computing environments, such as a hyperscale data center. For example, an event digest may address scalability of a monitoring solution to a larger number of parameters, a larger number of cores, and/or a larger number of nodes; use counters that are independent of OS/application requirements for performance monitoring/profiling; and/or aggregating telemetry points into one or more abstracted states of an observed platform.

In general, an event digest process may be operative to generate an event digest. An event digest may include information, such as platform metrics, for a computing platform, such as a data center, network, cloud computing environment, and/or the like. An event digest may include a compact representation of platform metrics. In some embodiments, event digest processes may be used as a solution for monitoring and usage of the digest to make scheduling decisions and/or to issue root causes in a distributed computing environment. A non-limiting example of a hyperscale data center may include an Infrastructure-as-a-Service (IaaS) cloud, for instance, supported by pooled hardware such as Intel® Rack Scale Design (RSD), and/or the like. In some embodiments, an event digest process may include providing a monitoring agent operative on at least one compute host of a cluster. In various embodiments, within the platform, metrics of interests may be queried. In some embodiments, the metrics of interest may be queried out-of-band (OoB). In some embodiments, the monitoring agent may create an event digest representation of the metrics based on user-defined thresholds ("metrics threshold"). In various embodiments, the event digest may be read by cloud management software and, if necessary, detailed metrics may be queried, for example, through in-band (IB) methods. In some embodiments, the cloud management software may use ranking to determine a host on which a new workload should be scheduled or to identify a cause of an alert condition and, if necessary, expand the cloud to schedule the new workload. For example, an RSD application programming interface (API) may be used to expand the cloud for the new workload.

Conventional datacenter configurations may monitor and/or manage resources based on platform networks using an in-band approach, where involvement from the OS or virtual machine manager (VMM) running on the system is provided to compile platform metrics and analyze the platform metrics. This involvement from the OS or VMM introduces overhead and latency by interrupting the normal operation of the OS/VMM and consuming compute cycles. By offloading these tasks to out-of-band systems in accordance with various embodiments, collection, aggregation and analysis of platform metrics may be performed without the use of Intel© Architecture (IA) cores or other cores implementing an OS or VMM. For instance, all or portions of an event digest process may be performed out-of-band, for example, and bypassing OS, VMM, and/or software to communicate directly to hardware, such as a chipset.

In some embodiments, a platform management process may use an event digest for management functions of a platform, such as a network, data center, hyperscale computing environment, distributed computing environment, cloud computing environment, and/or the like. In various embodiments, the management functions may include orchestration (for instance, scheduling, monitoring, and/or other management of automated tasks), error detection, resource management, load balancing, scheduling, optimization, and/or the like. For example, in some embodiments, a platform management process may create and/or access one or more event digests and consume the event digests for various management functions, such as scheduling or determining issue root causes.

In various embodiments, the platform management process may include, for each compute host (for instance, of a cluster) the platform metrics of interest are retrieved out-of-band and the event digest may be created. A monitoring agent may operate on or be accessible to each compute host in the cluster. The monitoring agent may retrieve one or more platform metrics (or digest values), for example, at predetermined access intervals and publishes the event digest. In some embodiments, the event digest may be published to a cloud controller (or other system manager). In various embodiments, the cloud controller may use the platform metrics within the digest data. If necessary, more detailed metrics may be queried through in-band methods. For scheduling, cloud management software may use raking to determine a host for scheduling new workloads and/or to identify a cause of an alert condition. For error identification, finer-grained in-band metrics may be obtained to identify potential root causes. Embodiments are not limited in this context.

In some embodiments, system manager may perform bare-metal monitoring (for instance, without virtualization). For systems that are provisioned as bare-metal systems, there may be various OS s, each requiring specific drivers and/or telemetry agents. In some embodiments, during the provisioning state, when the OS has not yet booted, the in-band telemetry may not be available. However, the out-of-band telemetry with an event digest process configured according to some embodiments may be available even without an OS and may not impact host performance. Accordingly, the out-of-band telemetry with an event digest process configured according to some embodiments may be operative for high-performance workloads, where the platform is fully utilized and where minimal impact on the host is required or desired. However, a telemetry agent using in-band methods uses compute time that alters the overall behavior of the corresponding computing system.

FIG. 1 illustrates an example of an operating environment 100 that may be representative of various embodiments. The operating environment 100 depicted in FIG. 1 may include an illustrative cloud computing environment in accordance with some embodiments. In general, cloud computing is a model of service delivery for enabling convenient, on-demand network access to a shared pool of configurable computing resources (for instance, networks, network bandwidth, servers, processing, memory, storage, applications, virtual machines, services, and/or the like). In typical cloud computing systems, one or more large cloud data centers house the machines used to deliver the services provided by the cloud. Referring now to FIG. 1, operating environment 100 may include cloud data centers 115a-n that are interconnected through cloud 120. Data centers 115a-n may provide cloud computing services to compute nodes 110a-n, which may also be connected to cloud 120.

In general, cloud data center 115a-n may include a physical arrangement of servers or server nodes that make up cloud 120 or a portion of a cloud 120. For example, servers can be physically arranged in cloud datacenters 115a-n in rooms, groups, rows, racks, and/or other physical arrangements. Cloud datacenters 115a-n may have one or more zones, which may include one or more rooms (or other physical arrangement or division) of servers. Each room may have one or more rows of servers, and each row may include one or more racks. Each rack may include one or more individual server nodes. Servers in zones, rooms, racks, and/or rows may be arranged into groups based on physical infrastructure and/or resource requirements of cloud datacenter 115a-n facilities, which may include power, energy, thermal, heat, and/or other requirements.

Cloud 120 may cloud data centers 115a-n along with one or more networks and networking resources (for example, networking equipment, nodes, routers, switches, networking cables, and/or the like) that interconnect cloud data centers 115a-n and help facilitate computing node 110a-n access to cloud computing services of cloud 120. In some embodiments, a network of cloud 120 may include any combination of one or more local networks, wide area networks, internetworks coupled using wired or wireless links deployed using terrestrial or satellite connections, and/or the like. Data exchanged over the network, may be transferred using any number of network layer protocols, such as Internet Protocol (IP), Multiprotocol Label Switching (MPLS), Asynchronous Transfer Mode (ATM), Frame Relay, and/or the like. In various embodiments, a network of cloud 120 may represent a combination of multiple sub-networks, in which different network layer protocols may be used at each of the underlying sub-networks. In some embodiments, a least a portion of a network of cloud 120 may represent one or more interconnected internetworks, such as the Internet.

Compute nodes 110a-n and/or cloud computing services consumers may be connected to cloud 120 through network links and/or network adapters. In some embodiments, compute nodes may be implemented as various computing devices, for example, servers, desktops, workstations, personal computers (PCs), network appliances, laptops, mobile computing devices, tablet computing device, smartphones, smart devices, consumer electronics, vehicle computing systems, and/or the like.

Figure 2:
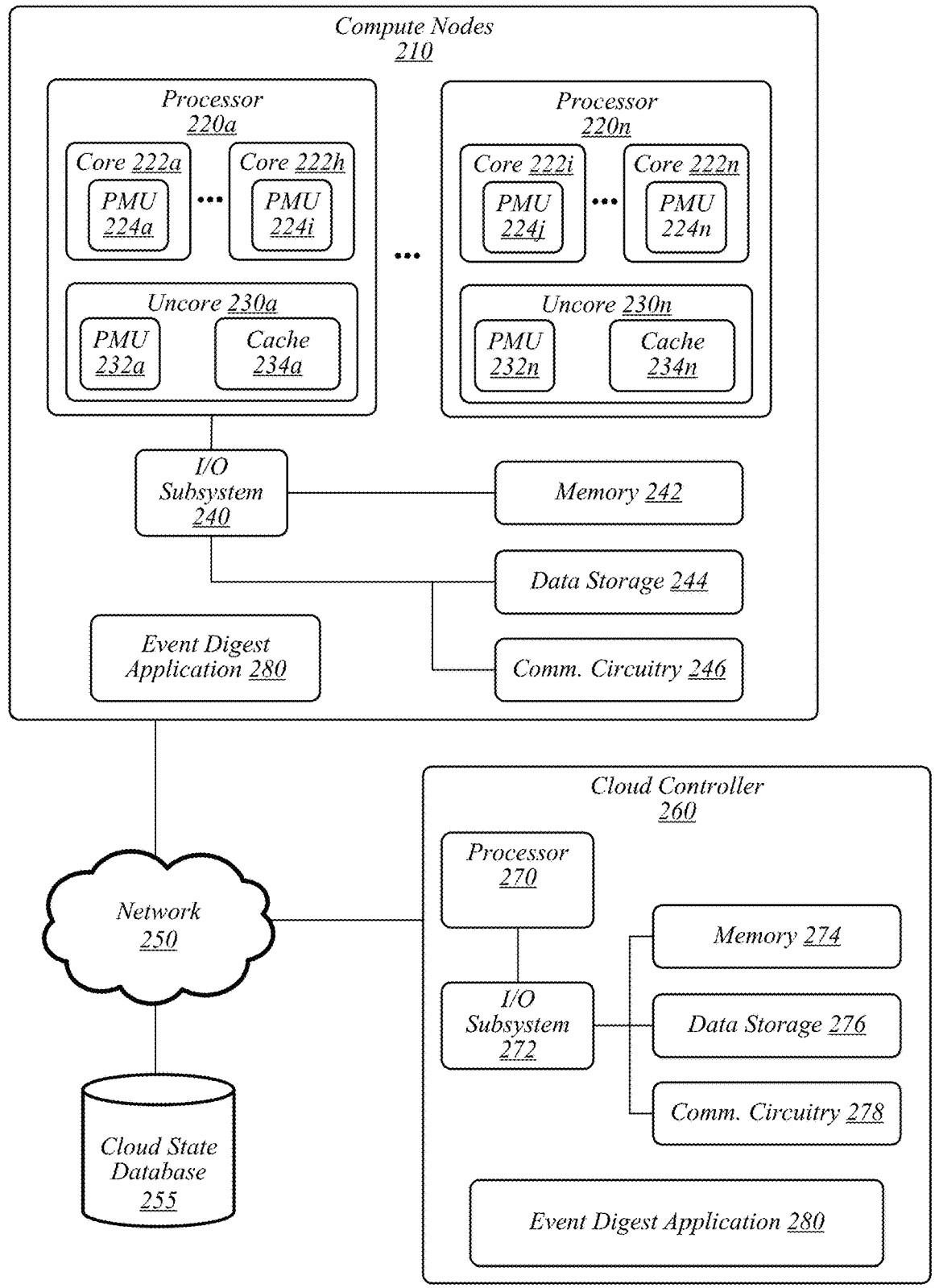
FIG. 2 illustrates an embodiment of a second operating environment.

FIG. 2 illustrates an example of an operating environment 200 that may be representative of various embodiments. The operating environment 200 depicted in FIG. 2 may include one or more compute nodes 210, one or more cloud controllers 260 (for instance, operating as system managers), and a cloud state database 255 in communication over a network 250. In some embodiments, operating environment 200 may include a cloud computing environment, such as cloud 120 of FIG. 1. For example, compute node 210 of FIG. 2 may include one of compute nodes 110a-n of FIG. 1.

In some embodiments, compute nodes 210 may instantiate one or more virtual machines to perform computational tasks. Each of compute nodes 210 may monitor its own performance, including cache contention, and generates contention and capacity scores. The contention scores for each compute node 210 may be stored in the cloud state database 255. In various embodiments, cloud controller 260 may monitor the contention scores and may schedule new virtual machines based on the reported contention scores of each of compute nodes 210.

In various embodiments, each compute node 210 may be embodied as any type of computation or computer device capable of performing the functions described herein, including, without limitation, a computer, a multiprocessor system, a server, a rack-mounted server, a blade server, a laptop computer, a notebook computer, a network appliance, a web appliance, a distributed computing system, a processor-based system, a consumer electronic device, combinations thereof, and/or the like. Each compute node 210 may include a plurality of processors 220a-n, an input/output (I/O) subsystem 240, a memory 242, a data storage device 244, communication circuitry 246, and/or the like. Compute nodes 210 may include other or additional components, such as those commonly found in a server device (for instance, transceivers, I/O devices, peripheral cards, and/or the like). Additionally, in some embodiments, one or more the components of compute nodes 210 may be incorporated in, or otherwise form a portion of, another component. For example, memory 242, or portions thereof, may be incorporated in one or more of processors 220a-n.

Each processor 220a-n may be embodied as any type of processor capable of performing functions according to some embodiments. In some embodiments, processors 220a-n may include a multi-core processor, however, in various other embodiments, each processor 220a-n may be embodied as a single or multi-core processor(s), digital signal processor, microcontroller, or other processor or processing/controlling circuit. Each processor 220a-n may include a plurality of cores 222a-n, such as two cores 222a-n, four cores 222a-n, and/or the like, and an uncore 230a-n.

Each processor core 220a-n may include a performance monitoring unit (PMU) 224a-n. In some embodiments, PMUs 224a-n may include one or more performance counters capable of recording and monitoring the flow of instructions through an associated processor core 222a-n. For example, each PMU 224a-n may count clock cycles, instructions issued, instructions retired, cache misses, and/or other events. PMUs 224a-n may be programmed to monitor particular performance statistics using model-5 specific registers of the processor cores 222a-n. In some embodiments, each PMU 224a-n may include fully programmable hardware counters and fixed-function hardware counters. In various embodiments, software may access PMUs 224a-n using a kernel interface, such as the "perf" subsystem of the Linux kernel, for example.

Processors 220a-n may includes an uncore 230a-n. In various embodiments, each uncore 230a-n may generally include any part of the particular processor 120 not included in the processor cores 222a-n (for instance, all or substantially all components of processor 220a-n except for the processor cores 222a-n themselves). For example, uncores 230a-n of processors 220a-n may include a PMU 232a-n and cache memory 234a-n. Similar to PMUs 224a-n of processor cores 222a-n, PMUs 232a-n may monitor performance statistics of uncores 230a-n, and may include a number of programmable or fixed-function hardware performance counters. In some embodiments, cache memory 234a-n may include a last-level cache (LLC) shared by processor cores 222a-n. In some embodiments, PMU 232a-n may monitor accesses to cache memory 234a-n, including recording cache misses, amounts of data transferred, and/or other cache information. Although not illustrated in FIG. 2, the uncore 230a-n may additionally include typical components of a processor or a system-on-a-chip (SoC). For example, each uncore 230a-n may include a memory controller, processor graphics, input/output controllers, power management circuitry, an accelerator, or other components of processors 220a-n.

In various embodiments, memory 242 may be embodied as any type of volatile or non-volatile memory or data storage capable of performing functions according to some embodiment. In operation, memory 242 may store various data and software used during operation of compute nodes 210, such as OSs, applications, programs, libraries, drivers, and/or the like. Memory 242 may be communicatively coupled to processors 220a-n via I/O subsystem 240, which may be embodied as circuitry and/or other components operative to facilitate I/O operations with processors 220a-n, memory 242, and/or other components of compute nodes 210. For example, I/O subsystem 240 may be embodied as, or otherwise include, memory controller hubs, I/O control hubs, firmware devices, communication links (for instance, point-to-point links, bus links, wires, cables, light guides, printed circuit board traces, and/or the like), and/or other components and subsystems to facilitate input/output operations. In some embodiments, I/O subsystem 240 may form a portion of a SoC and may be incorporated, along with processors 220a-n, memory 242, and other components of the compute node 210, on a single integrated circuit chip.

Data storage device 244 may be embodied as any type of device or devices configured for short-term or long-term storage of data such as, for example, memory devices and circuits, memory cards, hard disk drives, solid-state drives, and/or other data storage devices. In some embodiments, data storage device 244 may store performance statistics monitored by the compute nodes 210. Communication circuitry 246 may be embodied as any communication circuit, device, or collection thereof, capable of enabling communications between compute nodes 210, the cloud controller 260, cloud state database 255, and/or other remote devices over network 250. Communication circuitry 246 may be configured to use various communication technologies (for instance, wired or wireless communications) and associated protocols (for instance, Ethernet, Bluetooth®, Wi-Fi®, WiMAX, and/or the like) to effect such communication.

In some embodiments, cloud controller 260 may manage virtual machines or other compute instances distributed among compute nodes 210. Cloud controller 260 may be embodied as any type of server computing device, or collection of devices, capable of performing functions according to various embodiments. In some embodiments, cloud controller 260 may be embodied as a single server computing device or a collection of servers and associated devices. For example, in some embodiments, cloud controller 260 may be embodied as a "virtual server" formed from multiple computing devices distributed across network 108 and operating in a public or private cloud. Accordingly, although cloud controller 260 is illustrated in FIG. 2 as being embodied as a single server computing device, it should be appreciated that cloud controller 260 may be embodied as multiple devices cooperating together to facilitate functionality according to some embodiments. Cloud controller 260 may include a processor 270, an I/O subsystem 272, a memory 274, a data storage device 276, communication circuitry 278, and/or other components and devices commonly found in a server or similar computing device. Those individual components of cloud controller 260 may be similar to the corresponding components of compute nodes 210, the description of which is applicable to the corresponding components of cloud controller 260 and is not repeated herein so as not to obscure the present disclosure.

In some embodiments, cloud controller may include and/or have access to an event digest application 280. For example, event digest application 280 may be stored in memory 274 for execution by processor 270. In various embodiments, cloud controller 260 may operate a master, server, manager, or other controlling version of event digest application 280 (for instance, an application operating in user space. In some embodiments, compute nodes 210 may include event digest application 280 as firmware and/or operate (for instance, via execution by one or more of processors 220a-n) a client version of event digest application. In various embodiments, event digest application 280 operating on compute nodes 210 may include a monitoring agent to monitor and obtain values from event digests.

Figure 5:
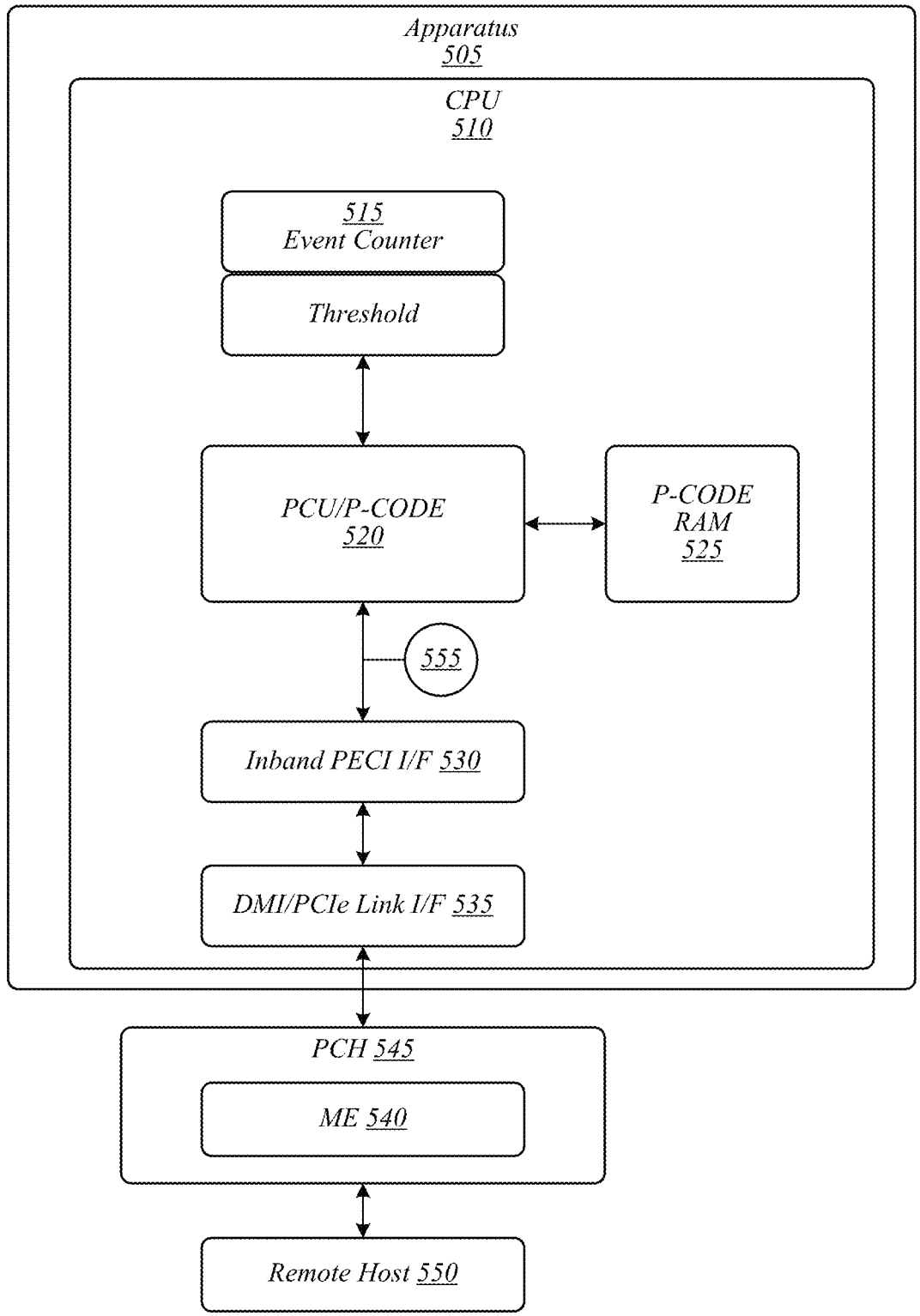
FIG. 5 illustrates an embodiment of a fifth operating environment.
Figure 6:
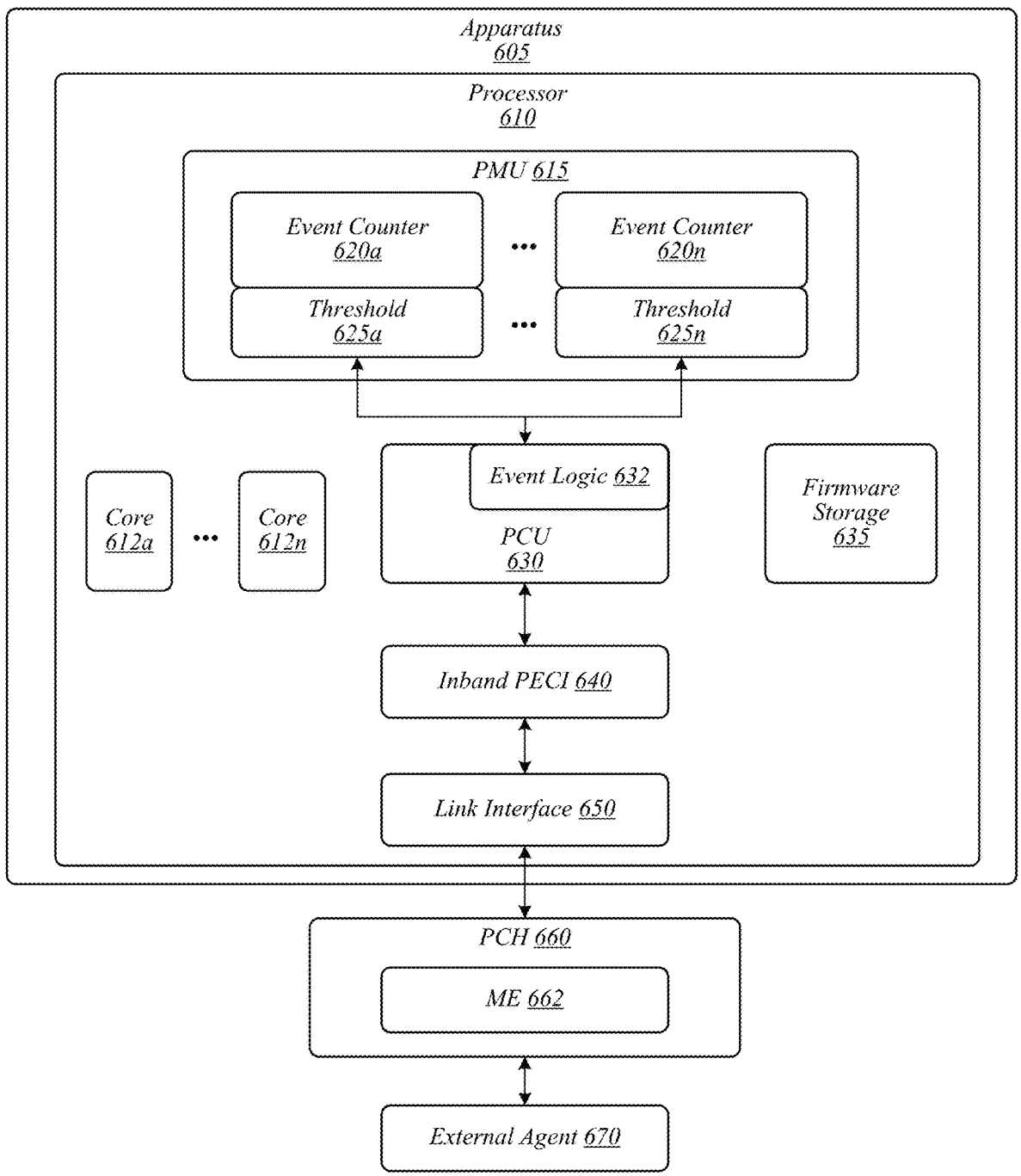
FIG. 6 illustrates an embodiment of a sixth operating environment.

In some embodiments, event digest application 280 may operate to set metrics threshold values for events, event counters, platform metrics, and/or the like (see, for example, event counter-threshold 515 of FIG. 5 and/or threshold 625a-n of FIG. 6). In some embodiments, at least a portion of the metrics thresholds may be programmed via threshold information received from a datacenter manager entered through event digest application 280. Accordingly, in some embodiments, event digest application 280 may include a user interface for a database manager, operator, or other user to view events, event counters, platform metrics, out-of-band information, and/or the like and to enter metrics thresholds or other information. In some embodiments, at least a portion of the metrics thresholds may be programmed automatically by event digest application 280 based on various parameters or other settings.

Cloud state database 255 may store information that is synchronized across operating environment 200, including, for example, performance statistics. Cloud state database 255 may be embodied as a dedicated database server, distributed data storage, or any other data storage system capable of maintaining consistent state for operating environment 200. As such, copies or portions of cloud state database 255 may be stored in data storage 244 of each compute node 210 and/or data storage 276 of cloud controller 260. Updated cloud state information may be transferred between compute nodes 210, cloud controller 260, and/or cloud state database 255 using various communication protocols. In some embodiments, cloud state information may be transferred asynchronously using a message bus, for example, a message bus implementing the advanced message queuing protocol (AMQP), such as RabbitMQ.

In some embodiments, compute nodes 210, cloud controller 260, and/or cloud state database 255 may be configured to transmit and receive data with each other and/or other devices operating environment over network 250. Network 250 may be embodied as any number of various wired and/or wireless networks. For example, network 250 may be embodied as, or otherwise include, a wired or wireless local area network (LAN), a wired or wireless wide area network (WAN), a cellular network, and/or a publicly-accessible, global network such as the Internet. As such, network 250 may include any number of additional devices, such as additional computers, routers, and switches, to facilitate communications among the elements of operating environment 200.

Figure 3:
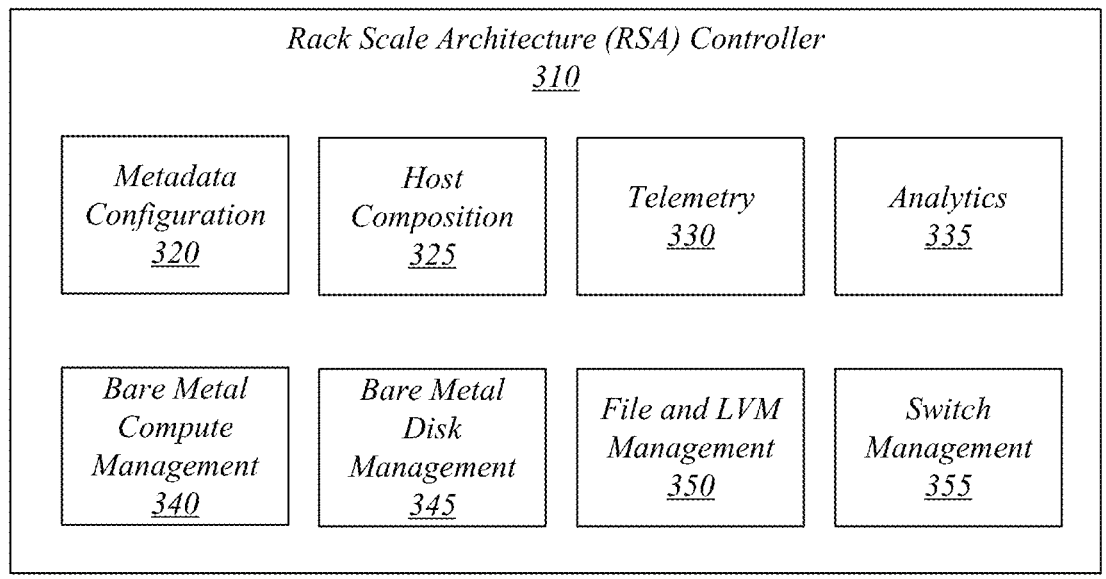
FIG. 3 illustrates an embodiment of a third operating environment.

FIG. 3 illustrates an example of an operating environment 300 that may be representative of various embodiments. The operating environment 300 depicted in FIG. 3 may include a controller 310, for instance, an RSA controller for a distributed computing environment according to some embodiments. RSA controller 310 may include various elements, including, without limitation, metadata configuration 320, host composition 325, telemetry 330, analytics 335, bare metal compute management 340, bare metal disk management 345, file and logical volume manager (LVM) management 350, and/or switch management 355. In some embodiments, RSA controller 310 may be responsible for composition of a system in response to requests. In some embodiments, RSA controller 310 may maintain the composed system status and alerts relating to health of composed systems. In various embodiments, RSA controller 310 may be responsible for exposing the discovered resources in portions of a distributed computing environment, such as a POD (for instance, a logical and/or physical collection of Racks within a shared infrastructure management domain), to other components, such as a respective orchestration controllers.

Figure 4:
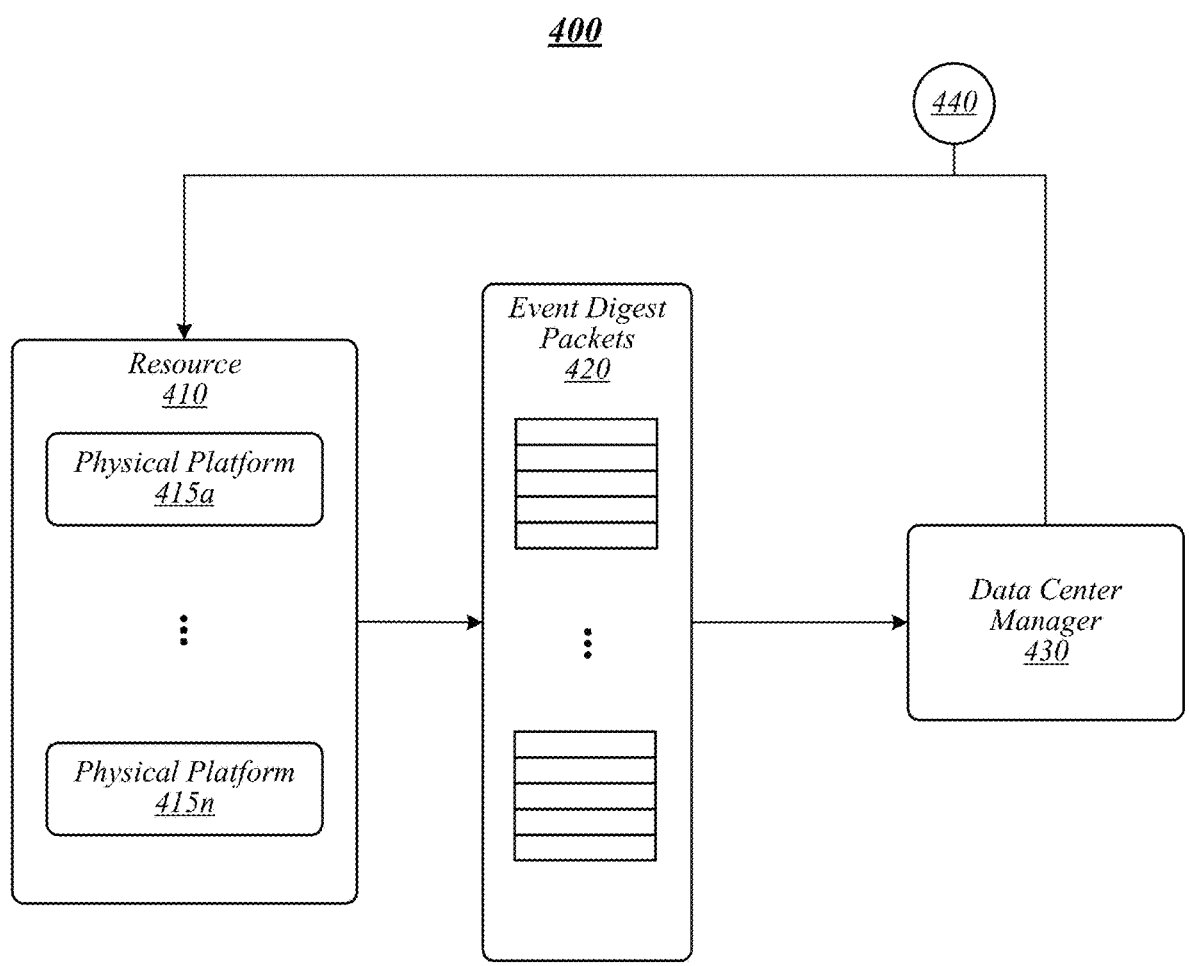
FIG. 4 illustrates an embodiment of a fourth operating environment.

FIG. 4 illustrates an example of an operating environment 400 that may be representative of various embodiments. More specifically, FIG. 4 illustrates a block diagram of a high level view of a communication arrangement in accordance with some embodiments. As shown in FIG. 4, operating environment 400 may include a monitored resource 410. In some embodiments, monitored resource 410 may include a collection of hardware resources, such as datacenter infrastructure or portions thereof. In various embodiments, monitored resource 410 may include a plurality of physical platforms 415a-n. Each of physical platforms 415a-n may correspond to a physical node or server system, for instance, a multicore server that is implemented in a server rack or other physical enclosure. However, physical platforms 415*a-n* are not limited this regard as physical platforms 415*a-n* may take various other forms, such other hardware components of a datacenter, networked environment, multiprocessor systems, single-processor systems, and/or the like. In various embodiments, each physical platform 415*a-n* may include one or more multicore processors that can generate and communicate events according to some embodiments.

In some embodiments, one or more of physical platforms 415*a-n*, for example, according to a periodic or asynchronous interval, may generate one or more event digest packets 420 that may be communicated to a datacenter manager 430. In various embodiments, datacenter manager 430 may correspond to a master control manager software for a datacenter or other networked environment. Based, at least in part, on event digest information provided via event digest packets 420, datacenter manager 430 may communicate instructions 440 to cause various workloads to be scheduled and/or migrated between different physical platforms 415*a-n*.

FIG. 5 illustrates an example of an operating environment 500 that may be representative of various embodiments. The operating environment 500 depicted in FIG. 5 may include a central processing unit (CPU) 510 and a management engine (ME). As shown in FIG. 5, ME 540 may be arranged in or otherwise associated with a platform controller hub (PCH) 545 in communication with one or more remote hosts 550. In some embodiments, PCH 545 may be operably coupled to CPU 510 via a direct media interface (DMI)/PCIe link, for example, via a DMI/PCIe link interface 535 of CPU 510. CPU 510 may include event counters 515, which may be associated with various metrics thresholds. In some embodiments, multiple metrics thresholds may be defined for each event, event counter 515, metric, and/or the like. In some embodiments, event counters 515 may interface with a power control unit (PCU) (for example, having and/or executing P-CODE) 520 in operable communication with P-CODE random access memory (RAM) 525. A message channel link may be used to facilitate communication between PCU/P-CODE 520 and an in-band platform environment control interface (PECI) 530. In some embodiments, a server system capable of performing management processes according to some embodiments may include a single socket Intel® Skylake microarchitecure processor with LBG chipset. In some embodiments, a server system capable of performing management processes according to some embodiments may include a dual socket Intel® Haswell microarchitecture processor with WBG chipset. Embodiments are not limited in this context.

In some embodiments, an event digest may not be available to a host OS and, for example, may be published using a platform sideband or out-of-band communication channel through industry standard interfaces, such as intelligent platform management interface (IPMI), PECI, representational state transfer (RESTful) application programming interfaces (APIs) (for example, Redfish® by the Distributed Management Task Force, Inc. (DMTF®), and/or the like. In various embodiments, a telemetry consumer may access the out-of-band channel and collect or receive metrics in various states of the system, including Sx states when the OS is not present, thereby reducing or even eliminating impacts on host performance. The Sx states may include, for example, multiple platform sleep states and/or power states according to Advanced Configuration and Power Interface (ACPI) Revision 6.2 (2017). In some embodiments, event digest values may be computed based on the measurements taken at the same time in a snapshot-like manner. Such measurements are typically not available in conventional in-band methods, where a monitoring application has only allocated a specific amount of CPU time and can be forced out by the host system during telemetry collection. If the telemetry is based on multiple agents, all running on the host, it is also likely that each will have different timings and an effort to compensate for these errors must be made. In conventional systems, the out-of-band communication uses a dedicated management network with a network interface controller (NIC) separated from a host customer network. Various metrics may be collected according to some embodiments, including, without limitation, CPU package power, CPU C0 residency, CPU efficient performance indicator, CPU uncore clocks, CPU memory bandwidth, average core frequency, and/or the like.

In some embodiments, an event digest may be published using a push process. In various embodiments, a push process may publish the event digest responsive to a publication event, including, without limitation, predefined intervals (for instance, expiration of a predefined time interval), an overflow of a metric, an underflow of a metric, a metric crossing a predefined metrics threshold (including some embodiments in which multiple metrics thresholds may be defined for a metric), and/or a metric crossing one or more quadrants. In some embodiments, an event digest may be published using a pull process. In various embodiments, a pull process may include an entity requesting to read the event digest, for example, an event digest packet being read by data center management software, for instance, through IPMI commands. In various embodiments, functionality operable using IPMI according to some embodiments may also be facilitated using various other protocols, including RESTful interfaces (for instance, Redfish® over Hyper Text Transfer Protocol Secure (HTTPS)).

In various embodiments, an event digest may be implemented as part of ME 540 firmware. In various embodiments, ME 540 may be or may include a hardware offload engine implementing the functionality of ME 540 according to some embodiments, for example, on a computing device being measured. In some embodiments, ME 540 firmware may be implemented as a component of a server chipset. ME 540 may monitor requested event counters 515, for instance, via PECI 530. For example, ME 540 may monitor requested event counters 515 in a synchronous manner, obtaining new measurements at periodic intervals (for instance, every 100 milliseconds (ms)) to produce the event digest. In some embodiments, the periodic intervals may be every about 10 ms, about 100 ms, about 500 ms, about 1 second (s), about 5 s, about 10 s, about 30 s, about 1 minute (m), about 5 m, about 10 m, about 60 m, or any value or range between any two of these values (including endpoints). A remote telemetry consumer may collect these values using an out-of-band channel with IPMI, for example, over Remote Management Control Protocol (RMCP) by using a baseboard management controller (BMC) as a bridge to access ME 540 and/or the like.

In some embodiments, the processing latency may generally include the time it takes to obtain and process measurements in ME 540 and the time required to collect the telemetry data packet—event digest. In various embodiments, multiple telemetry packets may be collected using the out-of-band channel, each packet with a single IPMI request. Each such packet can be a dedicated event digest for a particular element or function, such as a socket, platform power, thermal event digest, and/or the like. A session may be established whenever IPMI requests are made. Multiple commands in a batch may be executed in a single session. The average latency values may be computed based on a sample of a certain threshold of iterations for each packet count, for instance, every 1000 iterations.

An event digest according to some embodiments may require identifying the metrics threshold values for underlying metrics. In some embodiments, a stress tool, such as an Ubuntu® 15.10 system with system in idle state and at maximum utilization, may be used to effectively produce the range of expected values. The event digest may be configured using dedicated IPMI commands on ME 540 in runtime. In some embodiments, the accuracy and responsiveness to workloads of event digest may be evaluated using a comparison to inband monitoring, for example, using perfmon on Windows® Server 2012. Illustrative workloads may include linpack (for instance, with a problem size of 20,000 and an array lead dimension of 20,000), PTU (for example, with 23 core, CPU thermal design power (TDP)), and PTU (for example, memory read/write).

FIG. 6 illustrates an example of an operating environment 600 that may be representative of various embodiments. More specifically, FIG. 6 illustrates a block diagram of a portion of a server system operating environment in accordance with some embodiments. For example, operating environment 600 may include a portion of operating environment 400 of FIG. 4 associated with communication of monitored information from a processor and through a chipset component to an external entity via an out-of-band channel.

As shown in FIG. 6, operating environment 600 may include an apparatus 605 having a processor 610. In some embodiments, apparatus 605 may be a compute node operating with and/or within a cloud computing environment. Processor 610 may be a multicore processor including a plurality of cores 612*a-n*. In some embodiments, each of cores 612*a-n* may be a homogeneous core of a particular instruction set architecture (ISA) such as an out-of-order core. In some embodiments, one or more of cores 612*a-n* may be of heterogeneous design such as a lower power in-order core. In some embodiments, various combinations of different types of computing elements may be present in a single processor (also referred to herein as a CPU).

In various embodiments, processor 610 may include one or more event counters 620*a-n*, which may include a set of performance counters available in a PMU 615 of the processor. Although logically shown separate from the cores, in some embodiments, at least some of event counters 620*a-n* may be integrated within a PMU 615 that is within a core 612*a-n*. In such embodiments, each core 612*a-n* may include its own PMU 615 with corresponding counters (and associated hardware and/or software, such as threshold registers). Accordingly, event counters 620*a-n* may be available to one or more OS s and/or applications executing on processor 610. In this manner, event monitoring in accordance some embodiments may be performed in an OS- and/or application-transparent manner. In various embodiments, one or more threshold registers 625*a-n* may be included, for example, each associated with a corresponding event counter 620*a-n*. In various embodiments, threshold registers 625*a-n* may store metrics threshold values for a corresponding event counter 620*a-n*, for example, to provide an ability to determine when a particular metrics threshold value has been reached for an event metric.

In various embodiments, event counters 620*a-n* and/or threshold registers 625*a-n* may be in communication with a PCU 630. In some embodiments, PCU 630 may be a microcontroller-based agent of processor 610 operative to handle power management activities on behalf of an OS and to perform OS-transparent power management activities. In some embodiments, PCU 630 may include event logic 632 operative to receive communications from event counters 620*a-n* and to perform various processing on the received information, for example, to generate event digest packets according to various embodiments. In some embodiments, instructions to be performed by PCU 630 may be received via firmware storage 635, for example, RAM, to store firmware and/or other code for execution within PCU 630.

In some embodiments, when event logic 632 generates a platform event digest, associated information may be communicated via a message channel link. In some embodiments, for example, event digest packets may be communicated via an in-band PECI 640 directly out of processor 610. PECI 640 may include a single wire interface that enables communication of serial information to an external master, such as a peripheral controller. While this interface is typically used for purposes of communication of thermal and/or other environmental information of the processor, embodiments may leverage this link to communicate event digest packets via a virtual channel on this link. In other embodiments, the event digest packets may be sent from PECI 640 and in turn through a link interface 650. In various embodiments, link interface 650 may operate using one or more communication protocols, such as a DMI link and/or a PCIe link.

In various embodiments, communications of event digest packets may be to a peripheral controller hub (PCH) 660. Although shown as a separate component (and thus as a separate integrated circuit (IC)) in the embodiment of FIG. 6, embodiments are not so limited as PCH 660 may be integrated within the same IC as processor 610. In some embodiments, PCH 660 may include a manageability engine (ME) 662. In various embodiments, ME 662 may be operative to perform various virtualization operations on behalf of PCH 660 and/or to further handle incoming event digest packets and prepare them for communication to an external agent 670. In some embodiments, external agent 670 may be a management entity of a rack including the platform and/or datacenter management software. In some embodiments, the communication path between PCH 660 (and/or ME 662) and external agent 670 may be via an out-of-band link, such as a sideband channel, as the amount of information communicated between these components may be of relatively limited size, and thus a minimal amount of bandwidth is needed for the communication.

Figure 7:
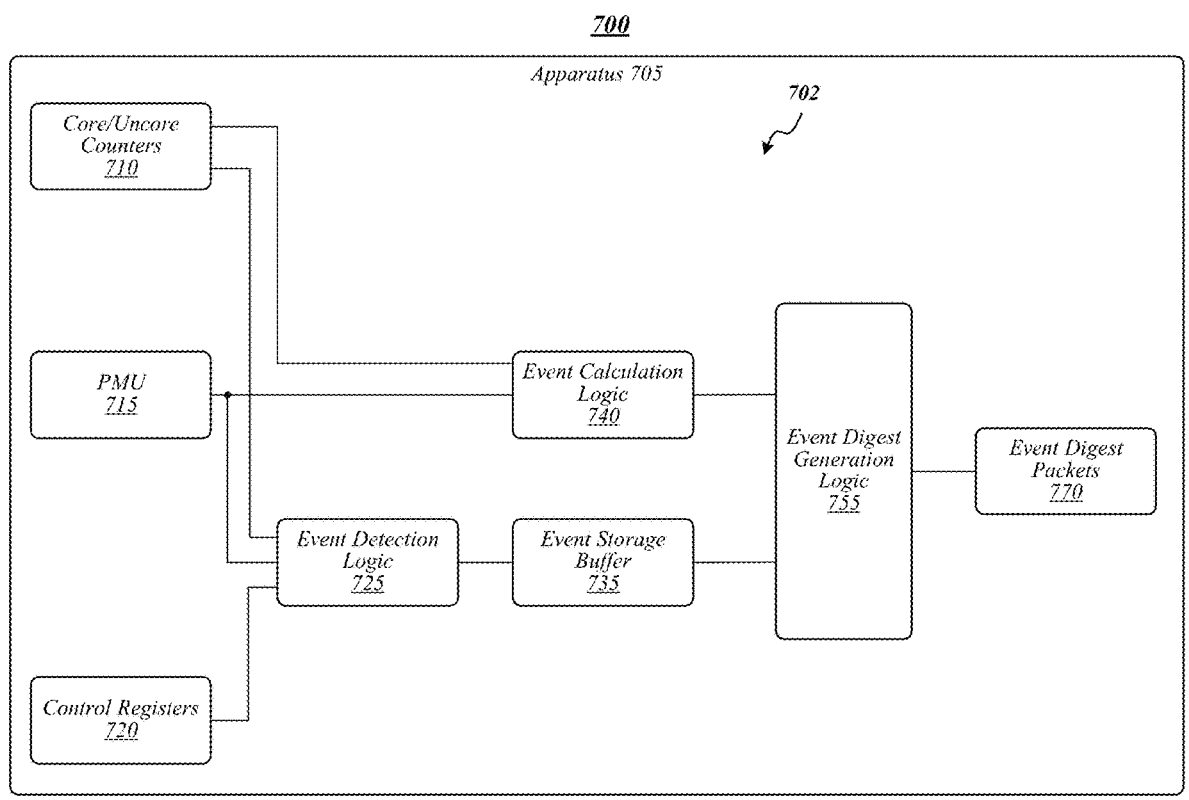
FIG. 7 illustrates an embodiment of a seventh operating environment.

FIG. 7 illustrates an example of an operating environment 700 that may be representative of various embodiments. More specifically, FIG. 7 depicts a block diagram of an event logic 702 in accordance some embodiments. Operating environment 700 may include an apparatus 705, for example, a compute node operating with and/or within a datacenter, cloud computing environment, and/or the like. At least a portion of the elements of event logic 702 or FIG. 7 may be arranged within a processor (not shown) of apparatus 705. For example, in some embodiments, event logic 702 may be implemented within a PCU (not shown) of a processor of apparatus 705. However, embodiments are not limited in this context as event logic 702 may be located in other hardware, software, and/or firmware of a processor of apparatus 705. In some embodiments, event logic 702 may be, include, and/or be a component of an event digest application (for example, event digest application 280).

As shown in FIG. 7, event detection logic 725 may receive incoming information from a set of core/uncore counters 710, a PMU 715, and/or a set of control registers 720. In some embodiments, core/uncore counters 710 may include various counters within a core or uncore of a processor that are separate from the counters or other performance monitors of PMU 715. Core/uncore counters 710 may include, without limitation, bandwidth counters, for example, for an interconnect of a processor, utilization counters, performance parameter counters, such as for instructions per cycle, last level cache misses, and/or the like. PMU 715 may communicate information from a wide variety of counters that are available to PMU 715. For instance, such counters may include cache misses, instructions per cycle, among many other counter types. Event detection logic 725 may receive information from a set of control registers 720. In various embodiments, control registers 720 may include threshold information such as a corresponding metrics threshold for at least some of counters 710. In some embodiments, control registers 720 may be programmed via information received from an external entity, such as software operated by a datacenter manager (for example, event digest application 280).

Information from counters 710, PMU 715, and/or control registers 720 may be provided to event detection logic 725, which may be operative to generate events based on a given count value of one or more counters and corresponding metrics threshold values. Generated events may be provided to an event storage buffer 735. Event calculation logic 740 may be operative to receive at least certain values from counters 710. Using event calculation logic 740, other events can be generated based on counters 710, which may correspond to either software-based (for instance, firmware-based) counters or combined hardware/software-based counters. In some embodiments, information from event calculation logic 740 and event storage buffer 735 can be provided to event digest generation logic 755, which may be operative to generate a corresponding event digest packet 770 for communication to an external entity, for instance via an out-of-band or sideband channel.

In various embodiments, a push model of counter overflow/underflow/threshold crossing information can enable interrupt delivery to an external entity via a sideband mechanism like PECI. These events may not be reported/visible to the OS/applications. Instead, all such events may be collected within event logic 702, and periodically an event digest may be sent to the entity (or entities) via sideband channels, such as PECI. In this manner, all periodic polling/reading by the datacenter manager software may be reduced or even eliminated. Accordingly, monitoring overhead may be removed from the main band in terms of CPU utilization, reducing, for example interface bandwidth utilization, datacenter manager software processing overhead, and/or the like.

In addition, in some embodiments a push model for delivering absolute values of certain parameters from a processor to a datacenter manager software may be performed. In such implementations, the periodicity of such updates may be programmable. For certain parameters/usage models, rather than an event reporting such as an event occurrence, the absolute value of a parameter may be delivered to the external entity. In some embodiments, such communication may also occur via a sideband interface.

Various different implementations of an event digest are possible according to some embodiment. In general, an event digest may be or may include a packet that provides information about which counters or other monitors of a predetermined set of monitors experienced an event, for example, within a time interval. In some embodiments, such an event may be an overflow event, an underflow event, or a threshold crossing event (for instance, when a given monitor has crossed a predetermined metrics threshold). As such, an event definition storage may be provided to enable programming of various controls of the events. A monitoring logic may, based on information in this storage, determine when a programmed event has occurred and update a corresponding event indicator of an event digest. In some embodiments, there may be more than one metrics threshold per counter.

The resulting event digest packet may include a plurality of indicator fields, such as a bit field (each of one or more bits) associated with each counter in the predetermined set of counters. The bits for each counter are used to encode information about the current status of that counter with respect to the pre-programmed event definition for the corresponding counter (for example, a threshold crossing, overflow, underflow event, and/or the like). In various embodiments, event digest packets can be sent on a periodic (for instance, programmable) basis or whenever a certain number of counters have had an event (where the number of counters may be programmable).

Monitoring is an essential operation within a distributed computing environment. However, conventional monitoring tools use in-band mechanisms which query the OS, virtual machine manager (VMM), applications, and/or platform components for metrics and transmit corresponding data over the network. As such, conventional monitoring tools require an operating system to be present and require valuable in-band resources. Accordingly, platform management processes according to some embodiments may provide an end-to-end solution using the event digest for cloud monitoring, scheduling, error handling, and/or other management processes within a distributed computing environment, such as a hyperscale computing environment.

Figure 8:
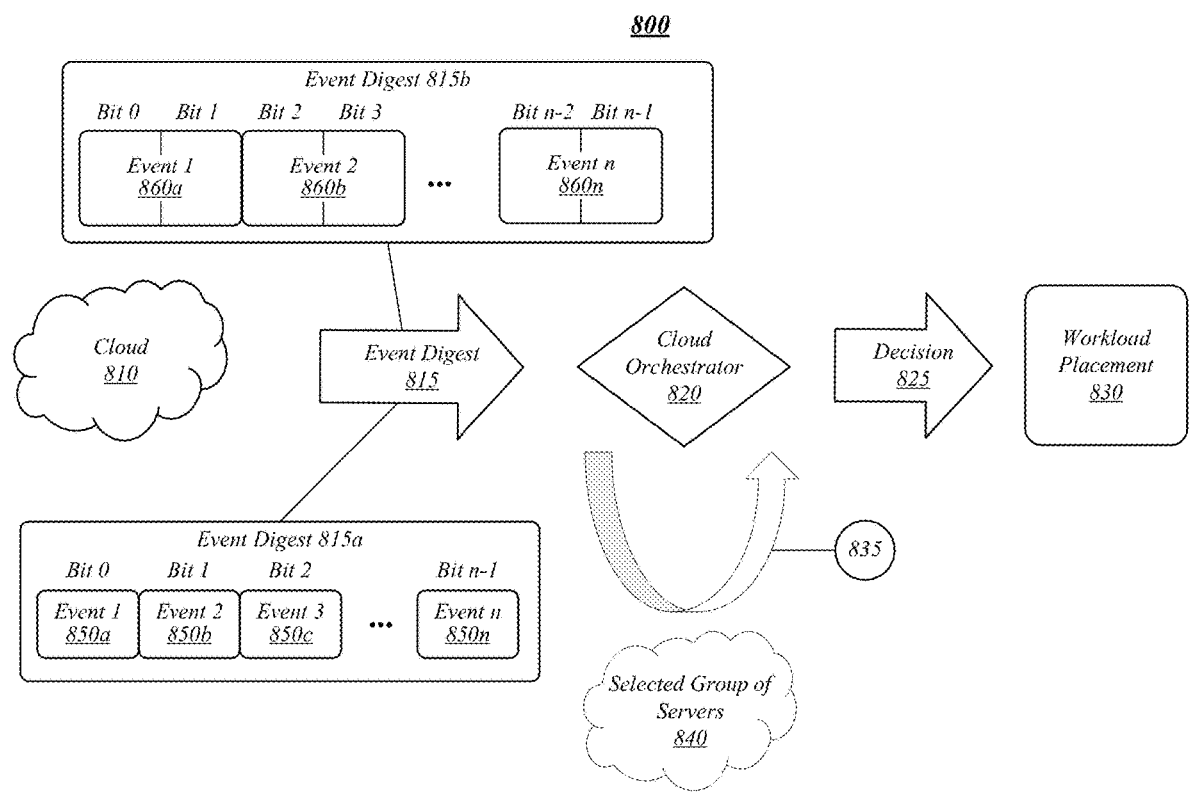
FIG. 8 illustrates an embodiment of an eighth operating environment.

FIG. 8 illustrates an example of an operating environment 800 that may be representative of various embodiments. The operating environment 800 depicted in FIG. 8 may include a cloud computing environment ("cloud") 810. The cloud 810 may include and/or may operate as various types of cloud computing environments, for instance, various "as-a-service" computing environments, including, without limitation IaaS, Software-as-a-Service (SaaS), Platform-as-a-Service (PaaS), and/or the like. Embodiments are not limited in this context.

In some embodiments, an event digest 815 may be generated and communicated to a cloud orchestrator 820 (for example, operating as a system manager). In various embodiments, cloud 810 may include one or more clusters having host computing nodes (or "compute host"), guest computing nodes, and/or the like. In some embodiments, for each host computing node in a cluster, platform metrics of interest may be retrieved out-of-band and used to create event digest 815. For example, a monitoring agent may have access to and/or may be operative on one or more host computing devices of a cluster. In various embodiments, the monitoring agent may retrieve the relevant digest values at regular intervals and publish event digest 815 to a cloud controller (for example, cloud controller 260). The cloud controller may use the various metrics within event digest 815. In some embodiments, if necessary, detailed telemetry or metrics 835 may be queried from a select subset of servers 840, for example, via in-band methods.

A decision 825 may be generated based on event digest 815 and communicated to a workload placement component and/or process 830. For example, during workload scheduling, cloud management software may use ranking to determine one or more hosts on which a new workload is to be scheduled and/or to identify a cause of an alert condition. In some embodiments, cloud 810 may be expanded, for instance, using an interface such as the Intel® RSD API, to schedule the new workload. In various embodiments, for error identification, finer-grained in-band metrics may be retrieved (for instance, via in-band detailed telemetry 835) to identify potential root causes.

Using operating environment 800 configured according to some embodiments, a telemetry consumer may access out-of-band channels and collect, aggregate, receive, or otherwise access metrics in any state of a system, such as cloud 810, including system level (for instance, "Sx") states when the corresponding OS is not present. Furthermore, such generation and/or access to metrics may not have any or essentially any substantive impact on host performance. In various embodiments, values for event digest 815 may be computed based at least in part on measurements taken at the same time (for instance, in a "snap-shot" manner), unlike with conventional in-band methods, where monitoring an application has only allocated a specific amount of CPU time and can be forced out by a host system during telemetry collection. In conventional systems, if the telemetry is based on multiple agents, all running on the host, it is likely that each agent will have different timings and resources must be expended to compensate for resulting errors. Furthermore, some embodiments may provide for reduced network load due to, among other things, concise representation of data.

Event digest 815 may include various event representation data structures. In some embodiments, each event may be allocated a certain number of bits, such as 2 bits, 3 bits, 4 bits, 5 bits, 8 bits, 10 bits, 12 bits, 16 bits, 20 bits, 32 bits, 64 bits, and/or any value or range of any of these values (including endpoints). In some embodiments, a 2-bit digest representation may be used to transmit data for event digest 815 from the compute nodes, for instance, of cloud 810 to a corresponding controller.

As shown in FIG. 8, event digest 815, such as depicted in the form of event digest 815$a$, may include a plurality of fields 850$a$-$n$. Each field 850$a$-$n$ may correspond to a given event and in an embodiment may be a single-bit field configured to indicate whether a given event has occurred. In some embodiments, for example, based on programming, event occurrence can correspond to a counter overflow, a counter underflow, or a counter reaching a predetermined threshold level. In various embodiments, a value of 1 for field 850$a$ (bit 0) may indicate that event 1 has occurred, and a value of 0 for field 850$a$ (bit 0) may indicate that event 1 has not occurred, or vice versa.

In some embodiments event digest 815 may have format provided with multiple bits per event. For example, event digest 815, such as depicted in the form of event digest 815$b$, may include a plurality of fields 860$a$-$n$. Each field 860$a$-$n$ may correspond to a given counter or other monitor and, in some embodiments, may be two-bit fields. For instance, each counter may be allocated 2 bits such that the counter bit field size in the event digest is 2. These two bits can be used to indicate presence of a counter value within a given range of a programmed metrics threshold. In other words, the event indicator may represent a location of a ratio value within a given range (such as a quadrant in the example of a two-bit indicator). More specifically, in some embodiments, this ratio may correspond to a comparison of a current counter value to a metrics threshold value (for instance, a counter value/metrics threshold value). For example, a measured value may be divided by the corresponding metrics threshold to generate a ratio. The ratio may be formed into a 2-bit representation. For example, in various embodiments, about 0.0-0.24 is represented as 00, about 0.25-0.49 is represented as 01, about 0.5-0.74 is represented as 10, and about 0.75-1.00 is represented as 11. In some embodiments, the event digest may use quadrant values such ratios between about 0.0.-0.24 are in a first quadrant ($1^{st}$ quadrant or "$1^{st}$"), about 0.25-0.49 are in a second quadrant ($2^{nd}$ quadrant or"$2^{nd}$"), about 0.5-0.74 are in a third quadrant ($3^{rd}$ quadrant or "$3^{rd}$") and about 0.75-1.00 are in a fourth quadrant ($4^{th}$ quadrant or "$4^{th}$"). The bit and/or quadrant representations are not limited, as various other representations may be used in accordance with some embodiments.

In some embodiments, a reporting mechanism may cause event digest 815 to be sent whenever there is a transition from one quadrant to another. In some embodiments, each counter may be allocated 2 bits such that the counter bit field size in the event digest is 2 to indicate the quadrant in which the ratio is located. In some embodiments, more bits per field may be provided to enable finer-grained information. In various embodiments, individual fields (for instance, either 850$a$-$n$ or 860$a$-$n$) may be extracted using bit operations (for instance, right shift, logical AND, logical OR, and/or the like).

For example, in some embodiments, each event may be allocated a certain number of bits, such as two bits, and filled based on quadrant representation of a value calculated based on a metrics threshold (for instance, a user-defined metrics threshold). Table 1 provides illustrative bit representation for events according to some embodiments:

TABLE 1

|  | Event_n | ... | Event2 | Event1 | Event0 |
|---|---|---|---|---|---|
| Bits | 2n−1-2n−2 |  |  | 3-2 | 1-0 |

Figure 9:
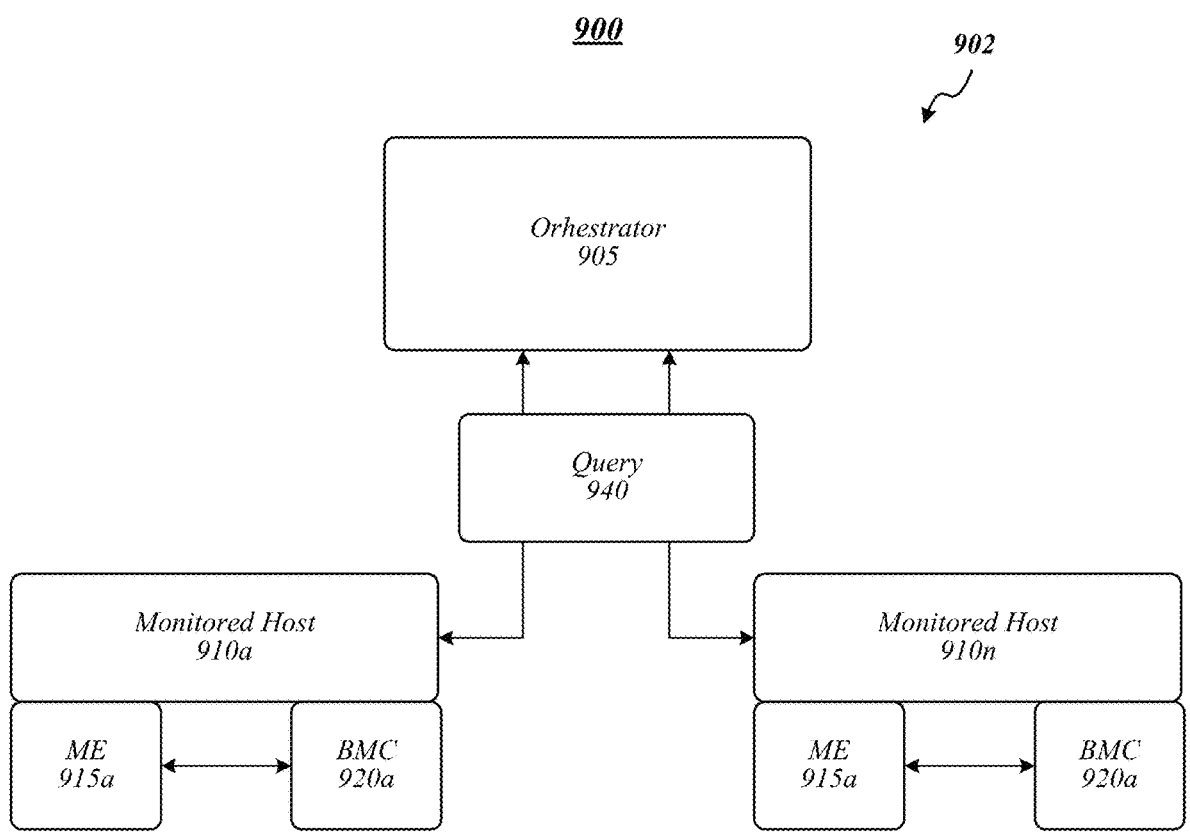
FIG. 9 illustrates an embodiment of a ninth operating environment.

FIG. 9 illustrates an example of an operating environment 900 that may be representative of various embodiments. The operating environment 900 depicted in FIG. 9 may include a cloud computing environment ("cloud") 902 having an orchestrator 905 coupled to a plurality of hosts 910$a$-$n$. In general, orchestrator 905 may be configured to, among other things, implement policies, manage the overall network of cloud 902, manage the cloud infrastructure, and/or the like. Orchestrator 905 may include and/or may operate with other cloud components to perform associated functions, such as various agents, a resource allocator, service chains, and/or the like. In some embodiments, orchestrator 905 may manage or otherwise control dispatching of information within cloud 902, such as telemetry information, service payloads, service metadata, device information, event digests, and/or the like. Hosts 910$a$-$n$ may be monitored hosts in which their platform metrics are monitored via event digest processes according to some embodiments. Hosts 910$a$-$n$ may include an ME 915$a$-$n$ and a BMC 920$a$-$n$. In various embodiments, MBC 920$a$-$n$ may be connected to one or more network controllers (such as network interface controllers (NICs)) to provide out-of-band communications and manageability. In some embodiments, orchestrator 905 may generate a query 940 to obtain information from or about hosts 910$a$-$n$. For instance, query 940 may include an out-of-band query operative to obtain event digest information generated according to some embodiments.

Included herein is a set of logic flows representative of exemplary methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on a non-transitory computer readable medium or machine readable medium, such as an optical, magnetic or semiconductor storage. The embodiments are not limited in this context.

Figure 10:
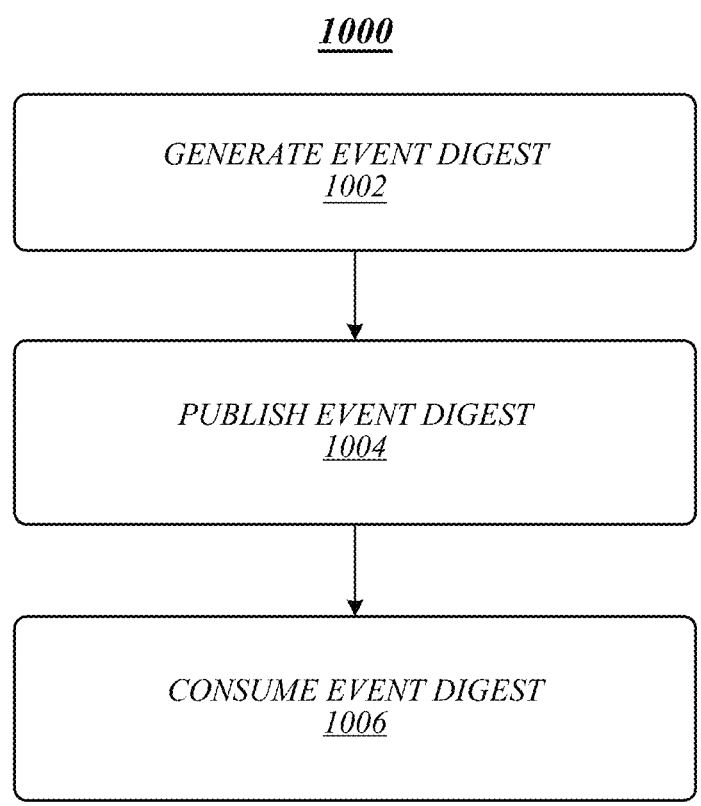
FIG. 10 illustrates an embodiment of a first logic flow.

FIG. 10 illustrates an embodiment of a logic flow 1000. Logic flow 1000 may be representative of some or all of the operations executed by one or more embodiments described herein, such as operations executed by one or more of compute nodes 210, cloud controller 260, RSA controller 310, data center manager 430, apparatus 505, apparatus 605, apparatus 705, and/or cloud orchestrator 820.

In the illustrated embodiment shown in FIG. 10, logic flow 1000 may generate an event digest at block 1002. For example, an event digest process (see, for example, FIG. 11) may be implemented via an ME, such as ME 540 or ME 662. In some embodiments, the event digest may be generated to be available out-of-band, for example, not available to a host OS. The generated event digest may be published using a platform sideband channel through industry standard interfaces, such as IPMI or PECI. In block 1004, logic flow 1000 may publish the event digest. The event digest may be published using a push mechanism, a pull mechanism, or a push mechanism and a pull mechanism. For example, a push mechanism may publish data at various publication events including, without limitation, at predefined intervals, an overflow of a metric, an underflow of a metric, when a metric crosses a present metrics threshold. In various embodiments, a pull process may include an event digest packet being read by data center management software, for instance, through IPMI commands. Logic flow 1000 may consume the event digest at block 1006 (see, for example, FIG. 12). For example, event digest may be consumed by a scheduler, orchestrator, or other management component for various functions, such as scheduling, computing environment re-sizing (for instance, cloud re-sizing), error detection, and/or the like. Event digest processes according to some embodiments may be configured to support hyperscale clouds, for example, that are created and managed by various infrastructure or architecture systems, such as Intel® RSD API. Event digest processes configured according to some embodiments may operate with or by various OSs and/or applications, such as various cloud management OSs (for instance, OpenStack cloud management OS).

Figure 11:
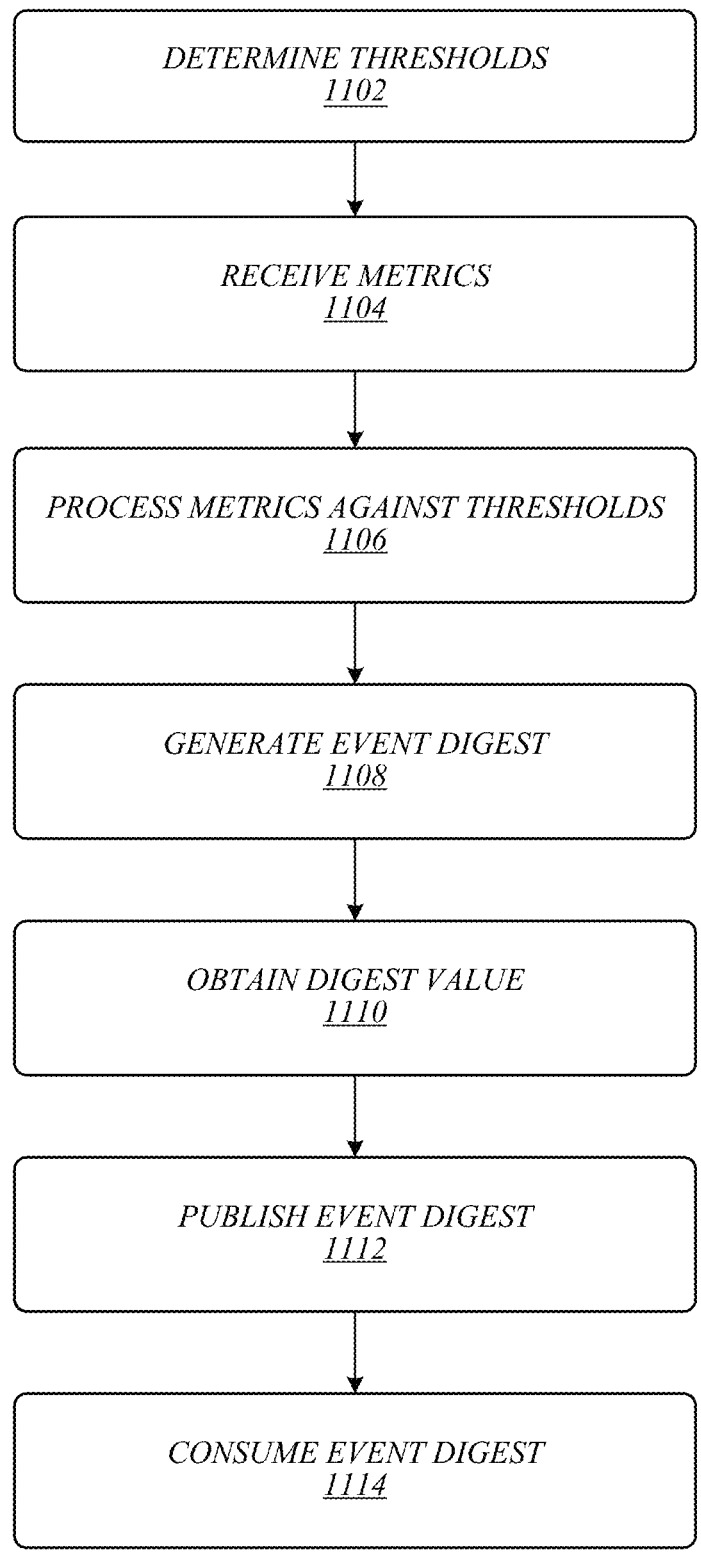
FIG. 11 illustrates an embodiment of a second logic flow.

FIG. 11 illustrates an embodiment of a logic flow 1100. Logic flow 1100 may be representative of some or all of the operations executed by one or more embodiments described herein, such as operations executed by one or more of compute nodes 210, cloud controller 260, RSA controller 310, data center manager 430, apparatus 505, apparatus 605, apparatus 705, and/or cloud orchestrator 820.

Logic flow 1100 may determine metrics thresholds at block 1102. For example, events, event counters, platform metrics, and/or the like to be monitored and metrics thresholds for monitored events, event counters, platform metrics, and/or the like may be determined via an application, such as event digest application 280 operating on controller 260. In some embodiments, each metrics threshold may be associated with an event counter. In some embodiments, events, event counters, platform metrics, and/or the like may include a plurality of metrics thresholds. Non-limiting examples of event counters include package power (for instance, power consumption in Watts), C0 state residency (for instance, clock cycles during CPU operational state), efficient performance indicator (for instance, a value correlated with the instructions retired), uncore clocks (for instance, mesh frequency), memory bandwidth (for instance, bandwidth in bytes/second), core frequency (for instance, frequency in gigahertz (GHz)), and/or the like. In various embodiments, at least a portion the metrics thresholds may be specified by an operator via event digest application 280. In various embodiments, at least a portion of metrics thresholds may be specified automatically via event digest application 280 based on one or more metrics threshold factors, such as resource requirements, resource demands, time of day, alerts, and/or the like.

Logic flow may receive metrics at block 1104. For example, ME 540 may monitor the event counters, for example, via PECI in a synchronous manner. In various embodiments, ME may obtain measurements at various measurement intervals, such as every 100 ms. At block 1106, the metrics may be processed against the metrics thresholds. For example, ME 540 may use the programmed metrics thresholds to determine a certain representation of each metric, such as a ratio of metric value/metrics threshold value. The ratio may be quantized into a bit-wise representation of the ratio. For example, the ratio may be formed into a 2-bit representation, where 0.0-0.24 is represented as 00, 0.25-0.49 is represented as 01, 0.5-0.74 is represented as 10, and 0.75-1.00 is represented as 11.

At block 1108, logic flow 1100 may generate the event digest. For example, ME 540 may generate an event digest using bit operations to store the bit-wise representations of multiple metrics in a multi-byte field. In an example, event digest 815*a* may include a plurality of fields 850*a-n*. Each field 850*a-n* may correspond to a given event and in an embodiment may be a single-bit field configured to indicate whether a given event has occurred. In another example, event digest 815*b* may include a plurality of fields 860*a-n*. Each field 860*a-n* may correspond to a given counter or other monitor and, in some embodiments, may be two-bit fields. For instance, each counter may be allocated 2 bits such that the counter bit field size in the event digest is 2. These two bits can be used to indicate presence of a counter value within a given range of a programmed metrics threshold. In other words, the event indicator may represent a location of a ratio value within a given range (such as a quadrant in the example of a two-bit indicator).

Logic flow 1100 may obtain the event digest at block 1110. For example, a monitoring agent of compute nodes 210 (for instance, event digest application 280) may obtain an event digest value from the event digest. Monitoring agent may obtain the event digest values at a specified monitoring interval, such as every 1 ms, every 10 ms, every 100 ms, every 1 s, every 5 s, and/or any value or range between any two of these values (including endpoints). In some embodiments, monitoring agent may have a different monitoring interval for at least a portion of the event digest values. At block 1112, the event digest may be published. For example, the monitoring agent of compute hosts 260 may publish or otherwise provide the event digest and/or event digest values to cloud controller 260 or compute hosts of cloud 81 may provide the event digest and/or event digest values to cloud orchestrator 820. In some embodiments, an event digest may not be available to a host OS and, for example, may be published using a platform sideband channel through industry standard interfaces, such as intelligent platform management interface (IPMI), PECI, and/or the like. In various embodiments, a telemetry consumer (for instance, cloud controller 260) may access the out-of-band channel and collect or receive metrics in various states of the system.

Logic flow 1100 may consume the event digest at block 1114. For example, cloud controller 260, cloud orchestrator 820, and/or the like may use the event digest information of the event digest to generate one or more decisions, such as decision 825 (see, for example, FIGS. 12 and 13). Non-limiting examples, of decisions may include scheduling, workload placement, resource allocation, generating an alert, determining a root cause of an issue or alert, and/or the like. For example, a decision 825 may be generated based on event digest 815 and communicated to a workload placement component and/or process 830. For example, during workload scheduling, cloud management software may use ranking to determine one or more hosts on which a new workload is to be scheduled and/or to identify a cause of an alert condition.

Figure 12:
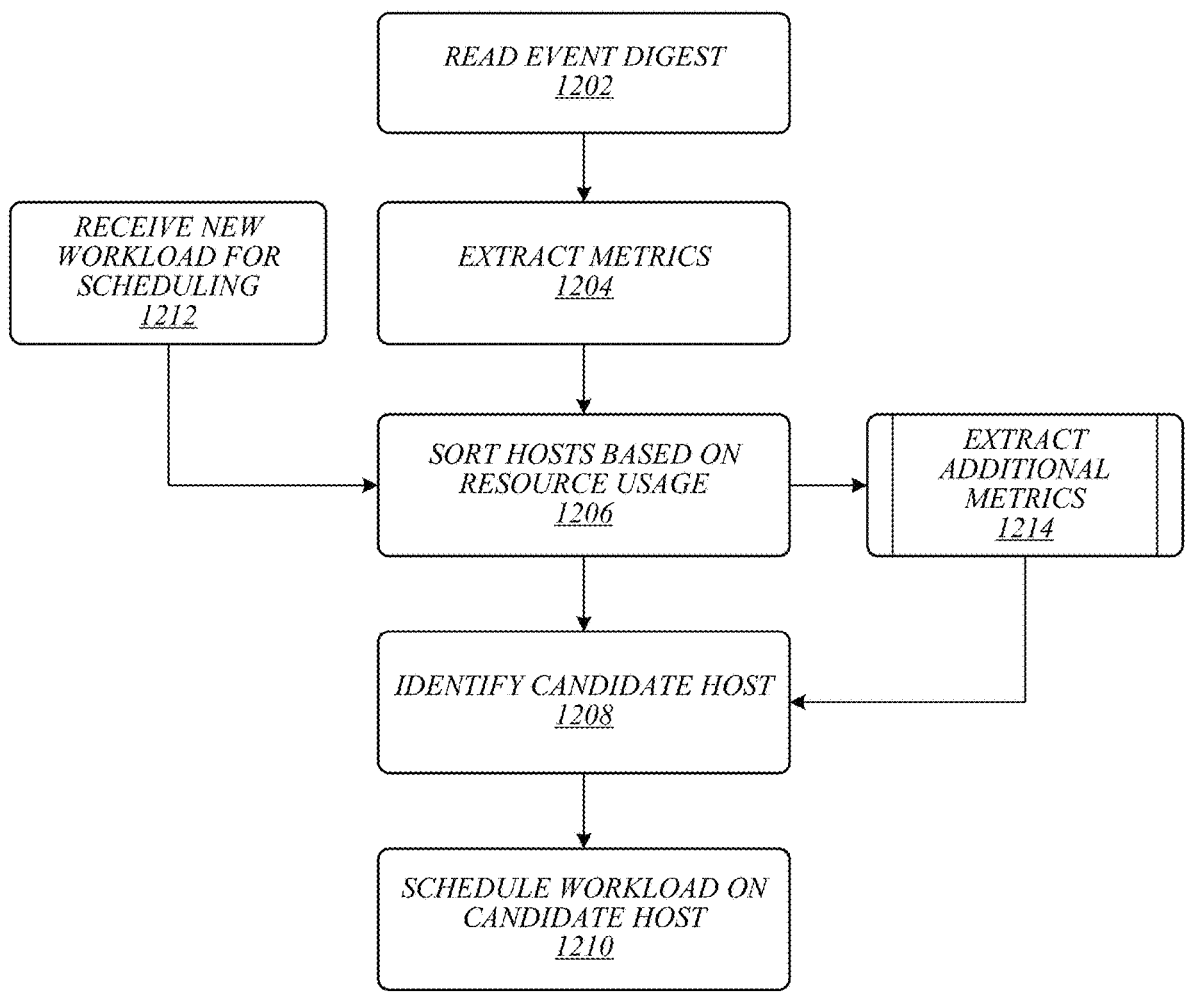
FIG. 12 illustrates an embodiment of a third logic flow.

FIG. 12 illustrates an embodiment of a logic flow 1200. Logic flow 1200 may be representative of some or all of the operations executed by one or more embodiments described herein, such as operations executed by one or more of compute nodes 210, cloud controller 260, RSA controller 310, data center manager 430, apparatus 505, apparatus 605, apparatus 705, and/or cloud orchestrator 820. More specifically, logic flow 1200 may include a process for scheduling a workload according to some embodiments. In some embodiments, logic flow 1200 may be at least partially implemented using a cloud scheduler, such as an OpenStack filter scheduler or an equivalent system.

Logic flow 1200 may read an event digest at block 1202. For example, a system manager or cloud manager, such as cloud controller 260, cloud orchestrator 820, a cloud scheduler, and/or the like, may analyze an event digest published or otherwise provided by a compute host. At block 1204, logic flow 1200 may extract metrics. For instance, the system manager may obtain event digest values, such as a numeric value of an event counter, a ratio corresponding to a comparison of a current counter value to a metrics threshold value, a value indicating an event has occurred, and/or the like.

At block 1206, logic flow 1200 may sort hosts based on resource usage. In some embodiments, a system manager, such as a cloud controller or cloud scheduler, may be invoked, for example, responsive to logic flow 1200 receiving a new workload for scheduling at block 1212. A non-limiting example of a system manager may include an OpenStack scheduler. In some embodiments, the system manager may first filter out nodes or hosts that cannot host a virtual machine (VM) instantiated by a user or other entity. In various embodiments, if no hosts are available, system manager may compose a node, for instance, via an Intel® RSD API. The composed node may be provisioned and software deployment initiated to add the newly composed node into the current cluster.

Logic flow 1200 may identify a candidate host at block 1208. For example, for each viable host, one or more fields may be extracted from the event digest to determine one or more weights. In an example, an event digest may have fields 1-5, each with an event digest value of a ratio of event counter value/metrics threshold, a numerical counter value, and/or a 1-bit value (for instance, indicating whether an event has occurred). The event digest values of fields 1-5 may be added together (for instance, aggregated) or otherwise processed for each host to generate a host weight. In some embodiments, one or more of the fields may have a greater or lesser proportion or weight ("value weight") in the overall host weight. In some embodiments, the value weights may be determined based on the relevance to a specific workload being scheduled. For instance, the value of field 1 may be multiplied by 1.5 such that the weight of field 1 is 1.5 times greater. In another instance, the value of field 2 may be multiplied by 0.5 such that the weight of field 2 is divided in half. In various embodiments, certain of the fields may be specified as not contributing to the weight. For example, the host weight may be determined based on a specified sub-set of fields, such as fields 1-3, and fields 4 and 5 may be excluded.

The system manager may sort the host based on weights, for instance, from lowest to highest or from highest to lowest, depending on the relationship or formulation of the host weights. For example, the host weights may correspond to the ability of a compute host to perform a workload, such that the greater the host weight the better suited (for instance, compatible) the host to perform a workload, or vice versa. Host compatibility for the workload may be based on various compatibility factors, such as workload compatibility with host hardware and/or software architecture (for example, whether workload would be executed more efficiently, requiring less resources, and/or the like). In another example, host weights may correspond to the available resources, efficiency, and/or the like of a host weight, such that a greater host weight may indicate that a host already has a greater resource usage (or, a lower resource availability, and therefore, would be less suited to take on a new workload) than a host with more availability, or vice versa. Embodiments are not limited in this context.

The system manager may identify the candidate host based on the event digest values, for example, through the use of weights according to some embodiments. In various embodiments, logic flow may extract additional metrics at optional block 1214. For instance, various platform metrics may also be obtained via one or more in-band processes or channels. For example, if the identification of a candidate host at block 1208 determines two or more viable candidate hosts (for instance, there is a tie), logic flow 1200 may use the additional metrics obtained at optional block 1214 to perform additional analysis, weighting, and/or the like to break the tie. In another example, logic flow 1200 may pick one of the viable candidate hosts based on various criteria (for instance, least-recently-used, most-recently-used, least-frequently-used, most-frequently-used, number of currently scheduled workloads, host configuration, host location, host owner, and/or the like).

Figure 13:
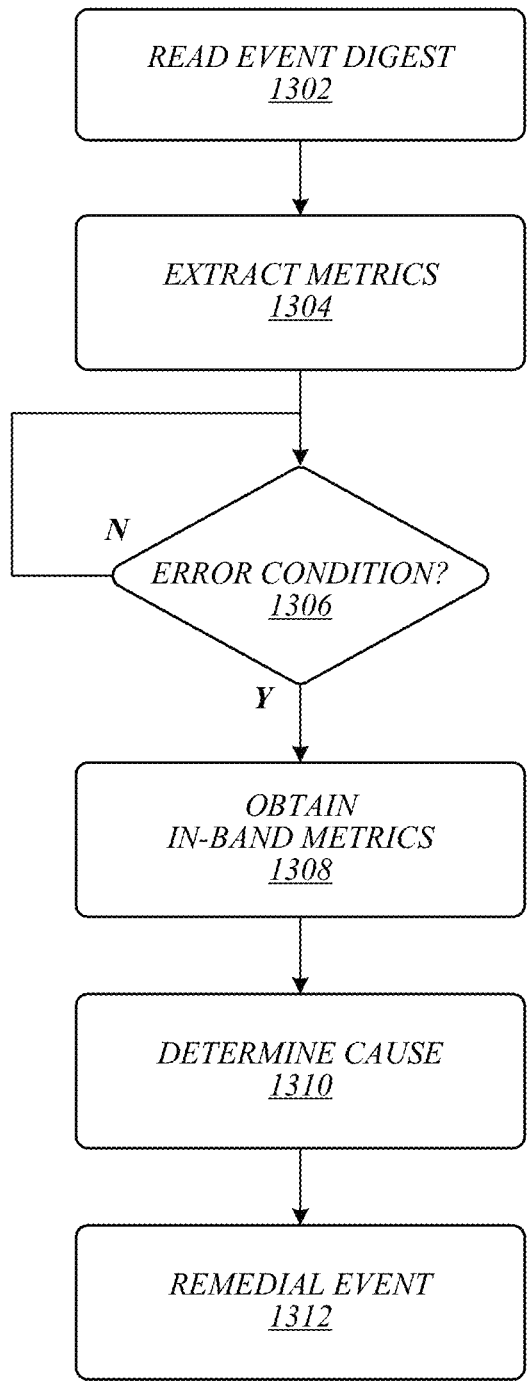
FIG. 13 illustrates an embodiment of a fourth logic flow.

FIG. 13 illustrates an embodiment of a logic flow 1200. Logic flow 1200 may be representative of some or all of the operations executed by one or more embodiments described herein, such as operations executed by one or more of compute nodes 210, cloud controller 260, RSA controller 310, data center manager 430, apparatus 505, apparatus 605, apparatus 705, and/or cloud orchestrator 820. More specifically, logic flow 1300 may include a process for error-handling according to some embodiments.

Logic flow 1300 may read an event digest at block 1302. For example, a system manager or cloud manager, such as cloud controller 260, cloud orchestrator 820, a cloud scheduler, and/or the like, may analyze an event digest published or otherwise provided by a compute host. At block 1304, logic flow 1300 may extract metrics. For instance, the system manager may obtain event digest values, such as a numeric value of an event counter, a ratio corresponding to a comparison of a current counter value to a metrics threshold value, a value indicating an event has occurred, and/or the like.

At decision block 1306, logic flow 1300 may determine whether there is an error condition. For example, the system manager may continually monitor the "health" of the computing system based at least in part on the metrics extracted by logic flow 1300 at block 1304. The system manager may determine that there is an error condition if an extracted metric (for instance, an event counter) has crossed a metrics threshold (for instance, for a multi-bit event counter value, a ratio associated with the event counter and metrics threshold, and/or the like) or an event has occurred (for instance, for a single-bit event counter where the single bit indicates whether a corresponding event has occurred).

If logic flow 1300 determines that there is an error condition at decision block 1306, logic flow 1300 may obtain in-band metrics at block 1308. For example, the system manager may initiate another level of analysis (a "supplemental analysis") by obtaining finer-grain data from in-band agents. In some embodiments, the supplemental analysis may include initiating monitoring in-band telemetry of one or more events, event counter, performance metrics and/or the like. In various embodiments, the supplemental analysis may include initiating the transmission of in-band telemetry that may be collected on a compute host or node.

At block 1310, logic flow 1300 may determine a root cause of the error condition. For example, the extracted metrics may indicate the occurrence of an event or a metric that is out of metrics threshold for a particular component of system (such as clock cycles for a processor of a compute host). In some embodiments, the in-band metrics may include more detailed information pertaining to a particular platform metric and/or system component. For example, system manager may determine an error condition based on the power consumption of a particular compute host being above a corresponding metrics threshold. System manager may access the more resource-expensive in-band metrics to determine a cause of the power consumption being above the metrics threshold, such as heat dissipation a processor core, software errors, switching device issues, clock issues, and/or the like. Logic flow 1300 may attempt a remedial event at block 1312. For example, system manager may attempt one or more remedial actions to solve the issue determined in decision block 1306 and/or block 1310. In some embodiments, a remedial action may include stopping the workload, transferring the workload to another virtual or physical host, generating an alarm, and/or the like. In some embodiments, a remedial action may include initiating an alert that may be received by an operator, such as an alert that may be visualized via a graphical user interface (GUI) on a console.

EXAMPLES

Example 1—Latency and Accuracy

An event digest and associated event digest packets were generated according to some embodiments in a computing environment that included compute hosts running at least one Intel®-based processor and a Windows® or Linux® OS. A one-time session setup latency of about 76 ms was experiences and an average latency of approximately 16 ms for each packet. The following Table 2 illustrates the latency associated with packets generated in the computing environment of Example 1:

TABLE 2

|  | Average Latency (ms) |
|---|---|
| Count of Telemetry Packets |  |
| 1 | 92.6 |
| 5 | 157.8 |
| 10 | 252.2 |
| 20 | 390.9 |
| 40 | 722.3 |
| Transport Latency |  |
| Session Cost | 75.9 |
| Single Packet Cost | 15.7 |

The following Table 3 provides data accuracy for the event digest generated in the computing environment of Example 1 comparing out-of-band event digest processes (ED) and in-band mechanisms (OS) values:

TABLE 3

| OS, workload | Processor Utilization | | CPU Power | | Memory | | Event Digest Value |
|---|---|---|---|---|---|---|---|
|  | ED | OS | ED | OS | ED | OS |  |
| Windows, idle | $1^{st}$ | 0% | $2^{nd}$ | 43 W | $1^{st}$ | 0 W | 1 |
| Windows, linpack | $4^{th}$ | 100% | $3^{rd}$ | 98 W | $1^{st}$ | 8 W | 3134 |
| Windows, PTU TDP | $4^{th}$ | 100% | $4^{th}$ | 116 W | $1^{st}$ | 8 W | 2107 |
| Windows, PTU Mem | $4^{th}$ | 88% | $3^{rd}$ | 104 W | $4^{th}$ | 14 W | 3902 |
| Linux, stress, -c 20 | $3^{rd}$ | 42% | $4^{th}$ | 115 W | $1^{st}$ | 8 W | 3131 |
| Linux, stress, -vm 10 | $2^{nd}$ | 21% | $3^{rd}$ | 78 W | $3^{rd}$ | 14 W | 1590 |
| Linux, stress, -c 20, -vm 10 | $3^{rd}$ | 41% | $4^{th}$ | 115 W | $3^{rd}$ | 14 W | 2619 |
| Linux, stress, -c 30, -vm 20 | $4^{th}$ | 100% | $4^{th}$ | 139 W | $3^{rd}$ | 14 W | 3631 |
| Linux, stress, -c 30, -vm 20 (throttled) | $1^{st}$ | 100% | $3^{rd}$ | 83 W | $1^{st}$ | 6 W | 1270 |

In TABLE 2, The "Event Digest Value" column provides a decimal representation of the digest value. In one example, for the "Windows, idle" OS and workload state, the processor utilization was determined to be 0, which may be represented in the event digest indicating utilization between 0-24% (or 0-25%), which is in the first quadrant. Similarly, CPU power was reported as 43 W by the OS, which is reported as 01 in the event digest to represent a value between 37.5 W-75 W in which the TDP of the processor was 150 W.

As indicated at least by Table 2, the latency required to implement event digest packets according to some embodiments is relatively minimal and, therefore, demonstrates the efficiency of the event digest process according to some embodiments. As indicated at least by Table 3, the out-of-band event digest process according to some embodiments demonstrates high accuracy for recording and analyzing platform metrics.

Example 2—Power Test

A power test was performed on a computing platform operating with at least one Intel®-based processor, including a processor from the Skylake family of Intel® processors configured according to some embodiments. The power test was performed with a single PMBus 1.2 compliant power supply unit (PSU), static workload (stress -c 30, -vm 20). An over-temperature warning (OT_WARNING) threshold was modified by writing to a corresponding device register. After a period of time (for instance, approximately 1 ms), the PSU asserted the SMBAlert line, resulting in the system throttling to ensure that the hardware survived a fault condition.

The event digest of the test system exposed 6 host-level metrics, each in a 2-bit representation, which required a total of 12 bits. The 12 bits may be stored and transmitted as a 2-byte field (for instance, 16 bits, with 4 unused bits). The amount of storage required to store the actual measured values was 27 bytes. Such a reduction from 27 bytes to 2 bytes results in a significant reduction in telemetry data transmitted from the monitored hosts to the telemetry consume compared with conventional, in-band methods. If finer-grained data is required, then specific hosts may be queried with in-band mechanisms. The following Table 4 provides the analyzed host metrics of the tests system:

TABLE 4

| Metric | Description | Storage Bytes |
|---|---|---|
| package power | Power consumption in Watts (W) | 1 byte |
| C0 residency | Clock cycles in C0 | 8 bytes (64 bit) |
| efficient performance indicator (EPI) | Number correlated with the instructions retired | 8 bytes (floating point number) |
| uncore clocks | Mesh frequency | 8 bytes |
| memory bandwidth | B/w in bytes/s | 1 byte |
| average core frequency | Frequency in Gigahertz (GHz) | 1 byte |

Figures 14A, 14B:
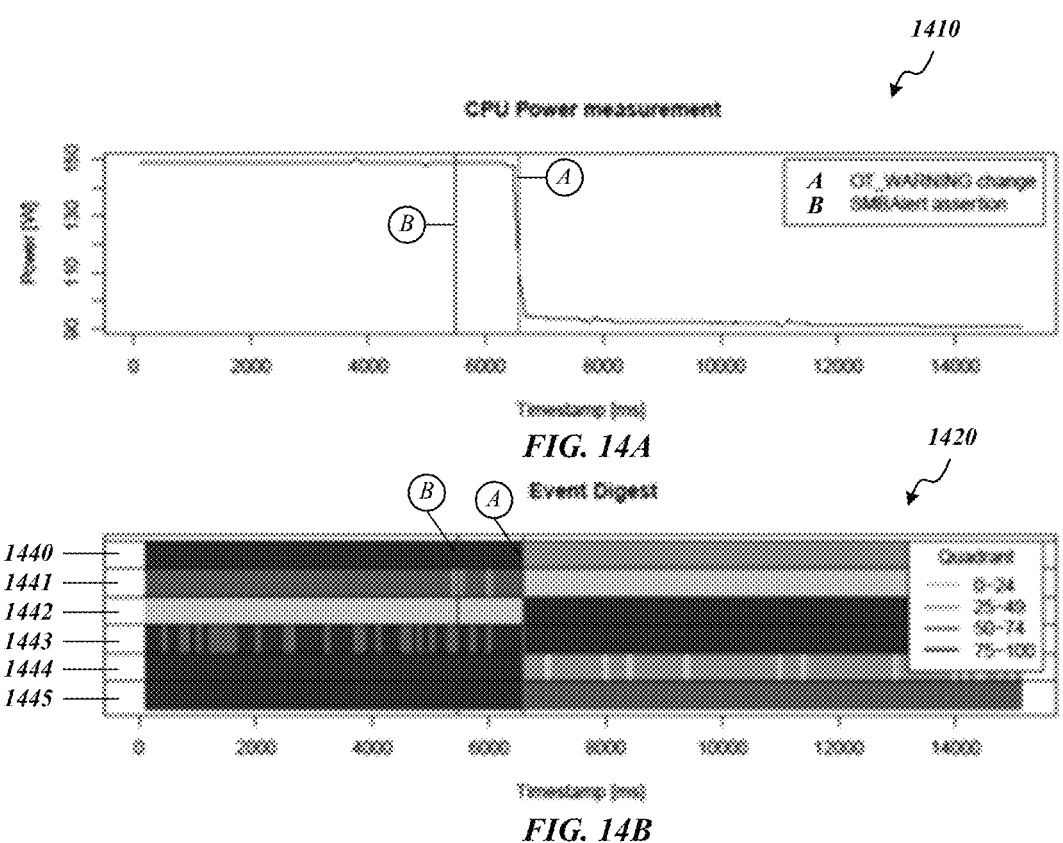
FIG. 14A depicts a graph of central processing unit (CPU) power measurements.
FIG. 14B depicts a graph of event digest values.

FIG. 14A depicts a graph of CPU power vs. time (depicted as time stamps) during the power test. Vertical lines A and B represent the OT_WARNING change and SMBAlert assertion, respectively, when throttling was engaged. FIG. 14B depicts a graph of event digest values over a time frame corresponding to that of FIG. 14A for package power 1440, C0 residency 1441, efficient performance indicator (EPI) 1442, uncore clocks 1443, memory bandwidth 1444, and average core frequency 1445.

When the test system was in full performance mode, event digest values indicated that package power 1440, C0 residency 1441, and average core frequency 1445 are in the 4th quadrant (for instance, about 0.75-1.00). An EPI 1442 toggling between quadrants may indicate that its measurement is near a threshold or is specifically related to the subject workload. When the test system was throttled, most of the processor core-related metrics values were reduced, which the uncore clocks 1443 and EPI 1442 increase. The state of change of the system could be easily identified by a telemetry consumer, thereby resulting in a faster response to a fault than available in conventional systems.

Figure 15:
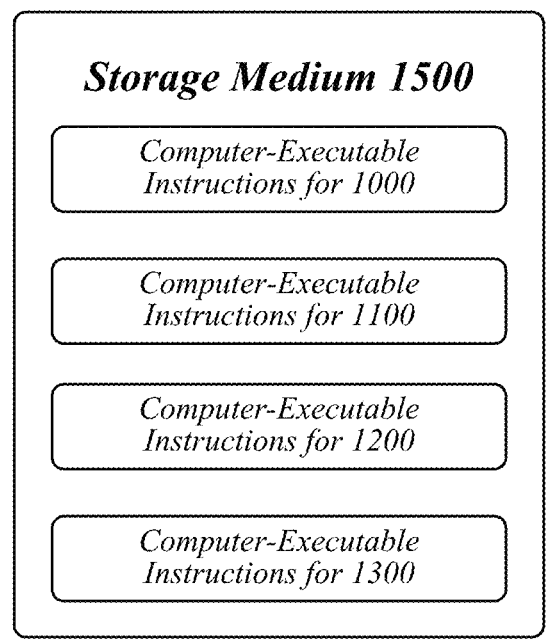
FIG. 15 illustrates an embodiment of a storage medium.

FIG. 15 illustrates an example of a storage medium 1500. Storage medium 1500 may comprise an article of manufacture. In some examples, storage medium 1500 may include any non-transitory computer readable medium or machine readable medium, such as an optical, magnetic or semiconductor storage. Storage medium 1500 may store various types of computer executable instructions, such as instructions to implement logic flow 1000, logic flow 1100, logic flow 1200, and/or logic flow 1300. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 16:
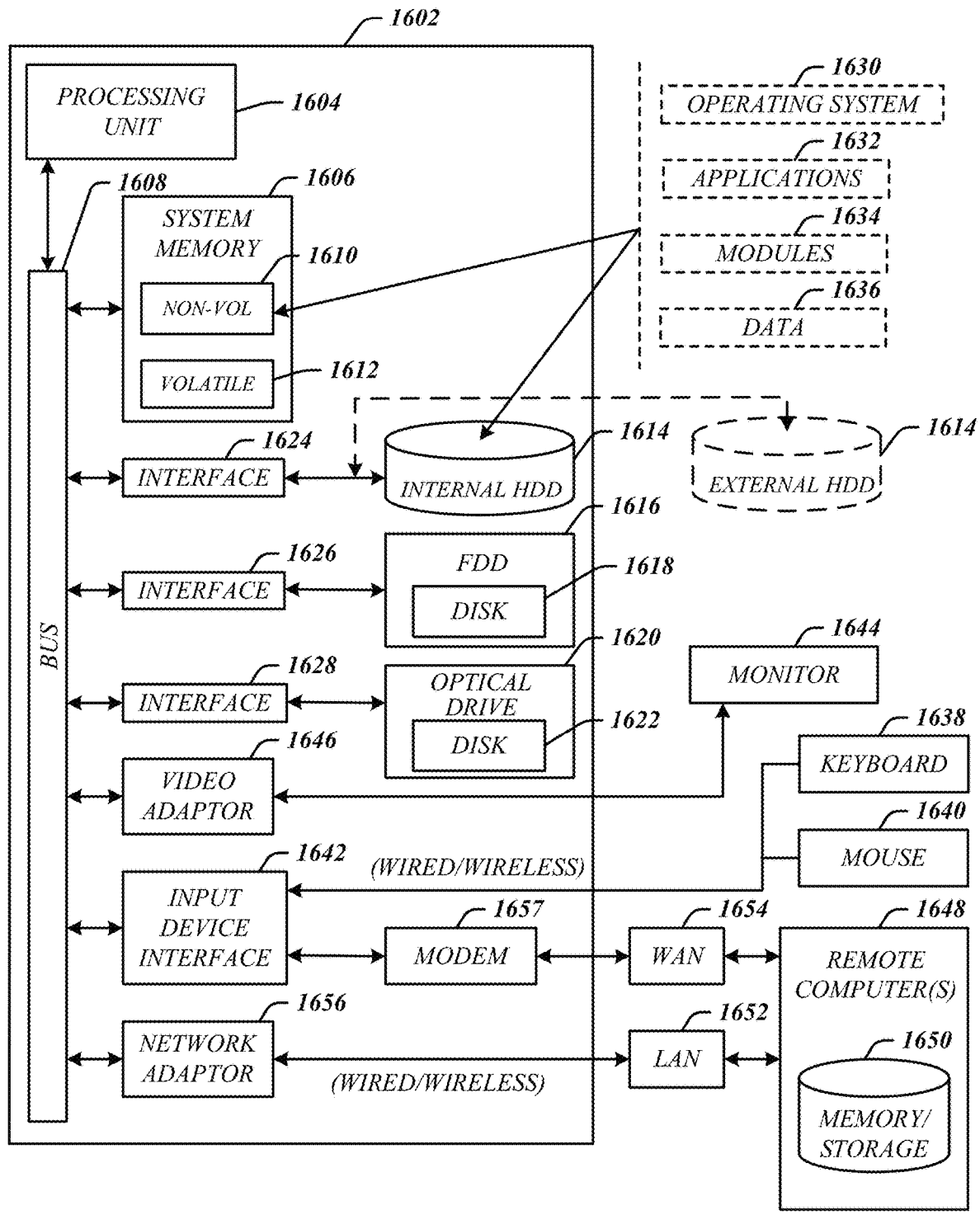
FIG. 16 illustrates an example computing platform.

FIG. 16 illustrates an embodiment of an exemplary computing architecture 1600 suitable for implementing various embodiments as previously described. In various embodiments, the computing architecture 1600 may comprise or be implemented as part of an electronic device. In some embodiments, the computing architecture 1600 may be representative, for example, of compute nodes 210, cloud controller 260, RSA controller 310, physical platform 415*a-n*, data center manager 430, apparatus 505, 605, and/or 705, and/or cloud orchestrator 820. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 1600. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 1600 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 1600.

As shown in FIG. 16, the computing architecture 1600 comprises a processing unit 1604, a system memory 1606 and a system bus 1608. The processing unit 1604 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors.

Dual microprocessors, multi-core processors, and other multi-processor architectures may also be employed as the processing unit 1604.

The system bus 1608 provides an interface for system components including, but not limited to, the system memory 1606 to the processing unit 1604. The system bus 1608 can be any of several types of bus structure that may further interconnect to a memory bus (with or without a memory controller), a peripheral bus, and a local bus using any of a variety of commercially available bus architectures. Interface adapters may connect to the system bus 1608 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 1606 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 16, the system memory 1606 can include non-volatile memory 1610 and/or volatile memory 1612. A basic input/output system (BIOS) can be stored in the non-volatile memory 1610.

The computer 1602 may include various types of computer-readable storage media in the form of one or more lower speed memory units, including an internal (or external) hard disk drive (HDD) 1614, a magnetic floppy disk drive (FDD) 1616 to read from or write to a removable magnetic disk 1618, and an optical disk drive 1620 to read from or write to a removable optical disk 1622 (e.g., a CD-ROM or DVD). The HDD 1614, FDD 1616 and optical disk drive 1620 can be connected to the system bus 1608 by a HDD interface 1624, an FDD interface 1626 and an optical drive interface 1628, respectively. The HDD interface 1624 for external drive implementations can include at least one or both of Universal Serial Bus (USB) and IEEE 1384 interface technologies.

The drives and associated computer-readable media provide volatile and/or nonvolatile storage of data, data structures, computer-executable instructions, and so forth. For example, a number of program modules can be stored in the drives and memory units 1610, 1612, including an operating system 1630, one or more application programs 1632, other program modules 1634, and program data 1636. In one embodiment, the one or more application programs 1632, other program modules 1634, and program data 1636 can include, for example, the various applications and/or components of compute nodes 210, cloud controller 260, RSA controller 310, physical platform 415*a-n*, data center manager 430, apparatus 505, 605, and/or 705, and/or cloud orchestrator 820.

A user can enter commands and information into the computer 1602 through one or more wire/wireless input devices, for example, a keyboard 1638 and a pointing device, such as a mouse 1640. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 1604 through an input device interface 1642 that is coupled to the system bus 1608, but can be connected by other interfaces such as a parallel port, IEEE 1384 serial port, a game port, a USB port, an IR interface, and so forth.

A monitor 1644 or other type of display device is also connected to the system bus 1608 via an interface, such as a video adaptor 1646. The monitor 1644 may be internal or external to the computer 1602. In addition to the monitor 1644, a computer typically includes other peripheral output devices, such as speakers, printers, and so forth.

The computer 1602 may operate in a networked environment using logical connections via wire and/or wireless communications to one or more remote computers, such as a remote computer 1648. The remote computer 1648 can be a workstation, a server computer, a router, a personal computer, portable computer, microprocessor-based entertainment appliance, a peer device or other common network node, and typically includes many or all of the elements described relative to the computer 1602, although, for purposes of brevity, only a memory/storage device 1650 is illustrated. The logical connections depicted include wire/wireless connectivity to a local area network (LAN) 1652 and/or larger networks, for example, a wide area network (WAN) 1654. Such LAN and WAN networking environments are commonplace in offices and companies, and facilitate enterprise-wide computer networks, such as intranets, all of which may connect to a global communications network, for example, the Internet.

When used in a LAN networking environment, the computer 1602 is connected to the LAN 1652 through a wire and/or wireless communication network interface or adaptor 1656. The adaptor 1656 can facilitate wire and/or wireless communications to the LAN 1652, which may also include a wireless access point disposed thereon for communicating with the wireless functionality of the adaptor 1656.

When used in a WAN networking environment, the computer 1602 can include a modem 1658, or is connected to a communications server on the WAN 1654, or has other means for establishing communications over the WAN 1654, such as by way of the Internet. The modem 1658, which can be internal or external and a wire and/or wireless device, connects to the system bus 1608 via the input device interface 1642. In a networked environment, program modules depicted relative to the computer 1602, or portions thereof, can be stored in the remote memory/storage device 1650. It will be appreciated that the network connections shown are exemplary and other means of establishing a communications link between the computers can be used.

The computer 1602 is operable to communicate with wire and wireless devices or entities using the IEEE 802 family of standards, such as wireless devices operatively disposed in wireless communication (e.g., IEEE 802.16 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following provide further example embodiments:

Example 1 is an apparatus, comprising at least one memory, and logic for a system manager, at least a portion of the logic comprised in hardware coupled to the at least one memory, the logic to determine a workload to schedule, access an event digest associated with a plurality of compute hosts, the event digest comprising event digest values determined using out-of-band information, determine metrics from the event digest, generate at least one host weight for at least a portion of the plurality of compute hosts based on the metrics, identify at least one candidate host from the portion of the plurality of compute hosts based on the at least one host weight, and schedule the workload on the at least one candidate host.

Example 2 is the apparatus of Example 1, the system manager comprising one of a cloud controller or a cloud orchestrator.

Example 3 is the apparatus of Example 1, the metrics comprising at least one of processor power, C0 residency, efficient performance indicator (EPI), uncore clocks, memory bandwidth, or core frequency.

Example 4 is the apparatus of Example 1, the logic to publish the event digest via a push process responsive to a publication event.

Example 5 is the apparatus of Example 1, the logic to publish the event digest via a push process responsive to a publication event, the publication event comprising at least one of expiration of a predefined time interval, an overflow of a metric, an underflow of a metric, a metric crossing a predefined metrics threshold, or a metric crossing one or more quadrants.

Example 6 is the apparatus of Example 1, the logic to receive the event digest from a monitoring agent of a compute host communicatively coupled to the apparatus.

Example 7 is the apparatus of Example 1, the logic to obtain in-band information responsive to identifying a plurality of candidate hosts.

Example 8 is the apparatus of Example 1, the logic to obtain in-band information responsive to identifying a plurality of candidate hosts, and determine a single candidate host based on the in-band information.

Example 9 is the apparatus of Example 1, the logic to generate the at least one host weight based on an aggregation of a plurality of fields of the event digest.

Example 10 is the apparatus of Example 1, the logic to generate the at least one host weight based on a sub-set of a plurality of fields of the event digest.

Example 11 is the apparatus of Example 1, the logic to generate the at least one weight to indicate a resource availability of the plurality of compute hosts.

Example 12 is the apparatus of Example 1, the logic to generate the at least one weight to indicate a compatibility of the at least one compute hosts to execute the workload.

Example 13 is the apparatus of Example 1, the logic to access the event digest via an out-of-band communication channel.

Example 14 is the apparatus of Example 1, the logic to access the event digest via an out-of-band communication channel comprising an intelligent platform management interface (IPMI) communication channel.

Example 15 is the apparatus of Example 1, the logic to access the event digest via an out-of-band communication channel comprising a platform environment control interface (PECI).

Example 16 is the apparatus of Example 1, the logic to access the event digest via an out-of-band communication channel comprising one of an intelligent platform management interface (IPMI) communication channel or a platform environment control interface (PECI).

Example 17 is the apparatus of Example 1, the logic to monitor for an error condition based on the metrics.

Example 18 is the apparatus of Example 1, the logic to monitor for an error condition based on the metrics, and obtain in-band metrics responsive to a detection of the error condition.

Example 19 is the apparatus of Example 1, the logic to monitor for an error condition based on the metrics, and obtain in-band metrics responsive to a detection of the error condition to determine a cause of the error condition.

Example 20 is the apparatus of Example 1, the logic to monitor for an error condition based on the metrics, and obtain in-band metrics responsive to a detection of the error condition to determine a remedial action for the error condition.

Example 21 is the apparatus of Example 1, the logic to determine an error condition based on one of the event digest values being outside of a threshold.

Example 22 is a system, comprising the apparatus according to any of claims 1-21, and at least one transceiver.

Example 23 is a method, comprising determining a workload to schedule, accessing an event digest associated with a plurality of compute hosts, the event digest comprising event digest values determined using out-of-band information, determining metrics from the event digest, generating at least one host weight for at least a portion of the plurality of compute hosts based on the metrics, identifying at least one candidate host from the portion of the plurality of compute hosts based on the at least one host weight, and scheduling the workload on the at least one candidate host.

Example 24 is the method of Example 23, the event digest accessed via a system manager operating on one of a cloud controller or a cloud orchestrator.

Example 25 is the method of Example 23, the metrics comprising at least one of processor power, C0 residency, efficient performance indicator (EPI), uncore clocks, memory bandwidth, or core frequency.

Example 26 is the method of Example 23, comprising publishing the event digest via a push process responsive to a publication event.

Example 27 is the method of Example 23, comprising publishing the event digest via a push process responsive to a publication event, the publication event comprising at least one of expiration of a predefined time interval, an overflow of a metric, an underflow of a metric, a metric crossing a predefined metrics threshold, or a metric crossing one or more quadrants.

Example 28 is the method of Example 23, comprising receiving the event digest from a monitoring agent of a compute host.

Example 29 is the method of Example 23, comprising obtaining in-band information responsive to identifying a plurality of candidate hosts.

Example 30 is the method of Example 23, comprising obtaining in-band information responsive to identifying a plurality of candidate hosts, and determining a single candidate host based on the in-band information.

Example 31 is the method of Example 23, comprising generating the at least one host weight based on an aggregation of a plurality of fields of the event digest.

Example 32 is the method of Example 23, comprising generating the at least one host weight based on a sub-set of a plurality of fields of the event digest.

Example 33 is the method of Example 23, comprising generating the at least one weight to indicate a resource availability of the plurality of compute hosts.

Example 34 is the method of Example 23, comprising generating the at least one weight to indicate a compatibility of the at least one compute hosts to execute the workload.

Example 35 is the method of Example 23, comprising accessing the event digest via an out-of-band communication channel.

Example 36 is the method of Example 23, comprising accessing the event digest via an out-of-band communication channel comprising an intelligent platform management interface (IPMI) communication channel.

Example 37 is the method of Example 23, comprising accessing the event digest via an out-of-band communication channel comprising a platform environment control interface (PECI).

Example 38 is the method of Example 23, comprising accessing the event digest via an out-of-band communication channel comprising one of an intelligent platform management interface (IPMI) communication channel or a platform environment control interface (PECI).

Example 39 is the method of Example 23, comprising monitoring for an error condition based on the metrics.

Example 40 is the method of Example 23, comprising monitoring for an error condition based on the metrics, and obtaining in-band metrics responsive to a detection of the error condition.

Example 41 is the method of Example 23, comprising monitoring for an error condition based on the metrics, and obtaining in-band metrics responsive to a detection of the error condition to determine a cause of the error condition.

Example 42 is the method of Example 23, comprising monitoring for an error condition based on the metrics, and obtaining in-band metrics responsive to a detection of the error condition to determine a remedial action for the error condition.

Example 43 is the method of Example 23, comprising determining an error condition based on one of the event digest values being outside of a threshold.

Example 44 is a computer-readable storage medium that stores instructions for execution by processing circuitry of a system manager, the instructions to cause the system manager to determine a workload to schedule, access an event digest associated with a plurality of compute hosts, the event digest comprising event digest values determined using out-of-band information, determine metrics from the event digest, generate at least one host weight for at least a portion of the plurality of compute hosts based on the metrics, identify at least one candidate host from the portion of the plurality of compute hosts based on the at least one host weight, and schedule the workload on the at least one candidate host.

Example 45 is the computer-readable storage medium of Example 44, the system manager comprising one of a cloud controller or a cloud orchestrator.

Example 46 is the computer-readable storage medium of Example 44, the metrics comprising at least one of processor power, C0 residency, efficient performance indicator (EPI), uncore clocks, memory bandwidth, or core frequency.

Example 47 is the computer-readable storage medium of Example 44, the instructions to cause the system manager to publish the event digest via a push process responsive to a publication event.

Example 48 is the computer-readable storage medium of Example 44, the instructions to cause the system manager to publish the event digest via a push process responsive to a publication event, the publication event comprising at least one of expiration of a predefined time interval, an overflow of a metric, an underflow of a metric, a metric crossing a predefined metrics threshold, or a metric crossing one or more quadrants.

Example 49 is the computer-readable storage medium of Example 44, the instructions to cause the system manager to receive the event digest from a monitoring agent of a compute host.

Example 50 is the computer-readable storage medium of Example 44, the instructions to cause the system manager to obtain in-band information responsive to identifying a plurality of candidate hosts.

Example 51 is the computer-readable storage medium of Example 44, the instructions to cause the system manager to obtain in-band information responsive to identifying a plurality of candidate hosts, and determine a single candidate host based on the in-band information.

Example 52 is the computer-readable storage medium of Example 44, the instructions to cause the system manager to generate the at least one host weight based on an aggregation of a plurality of fields of the event digest.

Example 53 is the computer-readable storage medium of Example 44, the instructions to cause the system manager to generate the at least one host weight based on a sub-set of a plurality of fields of the event digest.

Example 54 is the computer-readable storage medium of Example 44, the instructions to cause the system manager to generate the at least one weight to indicate a resource availability of the plurality of compute hosts.

Example 55 is the computer-readable storage medium of Example 44, the instructions to cause the system manager to generate the at least one weight to indicate a compatibility of the at least one compute hosts to execute the workload.

Example 56 is the computer-readable storage medium of Example 44, the instructions to cause the system manager to access the event digest via an out-of-band communication channel.

Example 57 is the computer-readable storage medium of Example 44, the instructions to cause the system manager to access the event digest via an out-of-band communication channel comprising an intelligent platform management interface (IPMI) communication channel.

Example 58 is the computer-readable storage medium of Example 44, the instructions to cause the system manager to access the event digest via an out-of-band communication channel comprising a platform environment control interface (PECI).

Example 59 is the computer-readable storage medium of Example 44, the instructions to cause the system manager to access the event digest via an out-of-band communication channel comprising one of an intelligent platform management interface (IPMI) communication channel or a platform environment control interface (PECI).

Example 60 is the computer-readable storage medium of Example 44, the instructions to cause the system manager to monitor for an error condition based on the metrics.

Example 61 is the computer-readable storage medium of Example 44, the instructions to cause the system manager to monitor for an error condition based on the metrics, and obtain in-band metrics responsive to a detection of the error condition.

Example 62 is the computer-readable storage medium of Example 44, the instructions to cause the system manager to monitor for an error condition based on the metrics, and obtain in-band metrics responsive to a detection of the error condition to determine a cause of the error condition.

Example 63 is the computer-readable storage medium of Example 44, the instructions to cause the system manager to monitor for an error condition based on the metrics, and obtain in-band metrics responsive to a detection of the error condition to determine a remedial action for the error condition.

Example 64 is the computer-readable storage medium of Example 44, the instructions to cause the system manager to determine an error condition based on one of the event digest values being outside of a threshold.

Example 65 is an apparatus, comprising an event digest monitoring means to access an event digest associated with a plurality of compute hosts, the event digest comprising event digest values determined using out-of-band information, and a scheduler means to determine a workload to schedule, determine metrics from the event digest, generate at least one host weight for at least a portion of the plurality of compute hosts based on the metrics, identify at least one candidate host from the portion of the plurality of compute hosts based on the at least one host weight, and schedule the workload on the at least one candidate host.

Example 66 is the apparatus of Example 65, the event digest monitoring means to access the event digest via a system manager operating on one of a cloud controller or a cloud orchestrator.

Example 67 is the apparatus of Example 65, the metrics comprising at least one of processor power, C0 residency, efficient performance indicator (EPI), uncore clocks, memory bandwidth, or core frequency.

Example 68 is the apparatus of Example 65, comprising a publishing means to publish the event digest via a push process responsive to a publication event.

Example 69 is the apparatus of Example 65, comprising a publishing means to publish the event digest via a push process responsive to a publication event, the publication event comprising at least one of expiration of a predefined time interval, an overflow of a metric, an underflow of a metric, a metric crossing a predefined metrics threshold, or a metric crossing one or more quadrants.

Example 70 is the apparatus of Example 65, the event digest monitoring means to receive the event digest from a monitoring agent of a compute host communicatively coupled to the apparatus.

Example 71 is the apparatus of Example 65, the scheduler means to obtain in-band information responsive to identifying a plurality of candidate hosts.

Example 72 is the apparatus of Example 65, the scheduler means to obtain in-band information responsive to identifying a plurality of candidate hosts, and determine a single candidate host based on the in-band information.

Example 73 is the apparatus of Example 65, the scheduler means to generate the at least one host weight based on an aggregation of a plurality of fields of the event digest.

Example 74 is the apparatus of Example 65, the scheduler means to generate the at least one host weight based on a sub-set of a plurality of fields of the event digest.

Example 75 is the apparatus of Example 65, the scheduler means to generate the at least one weight to indicate a resource availability of the plurality of compute hosts.

Example 76 is the apparatus of Example 65, the scheduler means to generate the at least one weight to indicate a compatibility of the at least one compute hosts to execute the workload.

Example 77 is the apparatus of Example 65, the event digest monitoring means to access the event digest via an out-of-band communication channel.

Example 78 is the apparatus of Example 65, the event digest monitoring means to access the event digest via an out-of-band communication channel comprising an intelligent platform management interface (IPMI) communication channel.

Example 79 is the apparatus of Example 65, the event digest monitoring means to access the event digest via an out-of-band communication channel comprising a platform environment control interface (PECI).

Example 80 is the apparatus of Example 65, the event digest monitoring means to access the event digest via an out-of-band communication channel comprising one of an intelligent platform management interface (IPMI) communication channel or a platform environment control interface (PECI).

Example 81 is the apparatus of Example 65, comprising an error detection means to monitor for an error condition based on the metrics.

Example 82 is the apparatus of Example 65, comprising an error detection means to monitor for an error condition based on the metrics, and obtain in-band metrics responsive to a detection of the error condition.

Example 83 is the apparatus of Example 65, comprising an error detection means to monitor for an error condition based on the metrics, and obtain in-band metrics responsive to a detection of the error condition to determine a cause of the error condition.

Example 84 is the apparatus of Example 65, comprising an error detection means to monitor for an error condition based on the metrics, and obtain in-band metrics responsive to a detection of the error condition to determine a remedial action for the error condition.

Example 85 is the apparatus of Example 65, comprising an error detection means to determine an error condition based on one of the event digest values being outside of a threshold.

Example 86 is a system, comprising the apparatus according to any of examples 65-85, and at least one transceiver.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   at least one memory; and
   logic for a system manager, at least a portion of the logic comprised in hardware coupled to the at least one memory, the logic to:
   determine a workload to schedule,
   access an event digest associated with a plurality of compute hosts, the event digest comprising event digest values determined using out-of-band information, at least a portion of the event digest values determined using out-of-band information during a provisioning state of a first compute host of the plurality of compute hosts,
   determine metrics from the event digest,
   compute at least one host weight for at least a portion of the plurality of compute hosts based on the metrics,
   identify at least one candidate host from the portion of the plurality of compute hosts based on the at least one host weight, and
   schedule the workload on the at least one candidate host.

2. The apparatus of claim 1, the system manager comprising one of a cloud controller or a cloud orchestrator, the provisioning state to comprise a state prior to booting of an operating system on the first compute host, the metrics comprising a sleep state or a power state of the first compute host during the provisioning state.

3. The apparatus of claim 1, the metrics comprising at least one of processor power, C0 residency, efficient performance indicator (EPI), uncore clocks, memory bandwidth, or core frequency.

4. The apparatus of claim 1, the logic to:
   obtain in-band information responsive to identifying a plurality of candidate hosts, and
   determine a single candidate host based on the in-band information.

5. The apparatus of claim 1, the logic to compute the at least one host weight based on an aggregation of a plurality of fields of the event digest.

6. The apparatus of claim 1, the logic to compute the at least one weight to indicate a resource availability of the plurality of compute hosts.

7. The apparatus of claim 1, the logic to compute the at least one weight to indicate a compatibility of the at least one compute hosts to execute the workload.

8. The apparatus of claim 1, the logic to access the event digest via an out-of-band communication channel comprising one of an intelligent platform management interface (IPMI) communication channel or a platform environment control interface (PECI), the logic to compute a respective weight for each of the plurality of compute hosts.

9. The apparatus of claim 1, the logic to:
   monitor for an error condition based on the metrics,
   detect the error condition based on the monitored metrics, and
   obtain in-band metrics based on the detection of the error condition to determine a cause of the error condition.

10. The apparatus of claim 1, the logic to:
    monitor for an error condition based on the metrics,
    detect the error condition based on the monitored metrics, and
    obtain in-band metrics based on the detection of the error condition to determine a remedial action for the error condition.

11. A method, comprising:
  determining a workload to schedule;
  accessing an event digest associated with a plurality of compute hosts, the event digest comprising event digest values determined using out-of-band information, at least a portion of the event digest values determined using out-of-band information during a provisioning state of a first compute host of the plurality of compute hosts;
  determining metrics from the event digest;
  computing at least one host weight for at least a portion of the plurality of compute hosts based on the metrics;
  identifying at least one candidate host from the portion of the plurality of compute hosts based on the at least one host weight; and
  scheduling the workload on the at least one candidate host.

12. The method of claim 11, the event digest accessed via a system manager operating on one of a cloud controller or a cloud orchestrator, the provisioning state to comprise a state prior to booting of an operating system on the first compute host, the metrics comprising a sleep state or a power state of the first compute host during the provisioning state.

13. The method of claim 11, the metrics comprising at least one of processor power, C0 residency, efficient performance indicator (EPI), uncore clocks, memory bandwidth, or core frequency.

14. The method of claim 11, comprising:
  obtaining in-band information responsive to identifying a plurality of candidate hosts, and
  determining a single candidate host based on the in-band information.

15. The method of claim 11, comprising computing the at least one host weight based on an aggregation of a plurality of fields of the event digest.

16. The method of claim 11, comprising computing the at least one weight to indicate a resource availability of the plurality of compute hosts.

17. The method of claim 11, comprising computing the at least one weight to indicate a compatibility of the at least one compute hosts to execute the workload.

18. The method of claim 11, comprising accessing the event digest via an out-of-band communication channel comprising one of an intelligent platform management interface (IPMI) communication channel or a platform environment control interface (PECI).

19. The method of claim 11, comprising:
  monitoring for an error condition based on the metrics,
  detecting the error condition based on the metrics, and
  obtaining in-band metrics based on the detection of the error condition to determine a cause of the error condition.

20. The method of claim 11, comprising:
  monitoring for an error condition based on the metrics,
  detecting the error condition based on the metrics, and
  obtaining in-band metrics based on the detection of the error condition to determine a remedial action for the error condition.

21. A non-transitory computer-readable storage medium that stores instructions for execution by processing circuitry of a system manager, the instructions to cause the system manager to:
  determine a workload to schedule;
  access an event digest associated with a plurality of compute hosts, the event digest comprising event digest values determined using out-of-band information, at least a portion of the event digest values determined using out-of-band information during a provisioning state of a first compute host of the plurality of compute hosts;
  determine metrics from the event digest;
  compute at least one host weight for at least a portion of the plurality of compute hosts based on the metrics;
  identify at least one candidate host from the portion of the plurality of compute hosts based on the at least one host weight; and
  schedule the workload on the at least one candidate host.

22. The computer-readable storage medium of claim 21, the metrics comprising at least one of processor power, C0 residency, efficient performance indicator (EPI), uncore clocks, memory bandwidth, or core frequency, the provisioning state to comprise a state prior to booting of an operating system on the first compute host.

23. The computer-readable storage medium of claim 21, the instructions to cause the system manager to:
  obtain in-band information responsive to identifying a plurality of candidate hosts, and
  determine a single candidate host based on the in-band information.

24. The computer-readable storage medium of claim 21, the instructions to cause the system manager to:
  monitor for an error condition based on the metrics,
  detect the error condition based on the metrics, and
  obtain in-band metrics based on the detection of the error condition to determine a cause of the error condition.

25. The computer-readable storage medium of claim 21, the instructions to cause the system manager to:
  monitor for an error condition based on the metrics,
  detect the error condition based on the metrics, and
  obtain in-band metrics based on the detection of the error condition to determine a remedial action for the error condition.

* * * * *